(12) United States Patent
Takahashi

(10) Patent No.: US 7,016,391 B2
(45) Date of Patent: Mar. 21, 2006

(54) GAIN-COUPLED DISTRIBUTED FEEDBACK SEMICONDUCTOR LASER DEVICE AND PRODUCTION METHOD THEREFOR

(75) Inventor: Koji Takahashi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/221,363

(22) PCT Filed: Feb. 7, 2001

(86) PCT No.: PCT/JP01/00838

§ 371 (c)(1),
(2), (4) Date: Sep. 12, 2002

(87) PCT Pub. No.: WO01/69735

PCT Pub. Date: Sep. 20, 2001

(65) Prior Publication Data

US 2003/0039287 A1    Feb. 27, 2003

(30) Foreign Application Priority Data

Mar. 13, 2000 (JP) ............................. 2000-068500

(51) Int. Cl.
*H01S 3/08* (2006.01)
*H01S 5/00* (2006.01)
(52) U.S. Cl. ................... 372/96; 372/45.01; 372/46.01
(58) Field of Classification Search ................. 372/45, 372/46, 50, 96
See application file for complete search history.

(56) References Cited

U.S. PATENT DOCUMENTS

| 5,093,835 | A |   | 3/1992  | Takemoto et al. |       |
|-----------|---|---|---------|-----------------|-------|
| 5,143,864 | A |   | 9/1992  | Takemoto et al. |       |
| 5,276,702 | A |   | 1/1994  | Meliga          |       |
| 5,452,318 | A | * | 9/1995  | Makino et al.   | 372/96 |
| 5,689,123 | A | * | 11/1997 | Major et al.    | 257/190 |
| 5,852,625 | A | * | 12/1998 | Takahashi       | 372/96 |
| 6,151,347 | A | * | 11/2000 | Noel et al.     | 372/45 |
| 6,493,369 | B1| * | 12/2002 | Funabashi et al.| 372/49 |

(Continued)

FOREIGN PATENT DOCUMENTS

EP       0 513 745       11/1992

(Continued)

OTHER PUBLICATIONS

Kitatani et al; "Characterization of the Refractive Index of Strained GaInNAs Layers by Spectroscopic Ellipsometry"; Jpn, J. Appl.. Phys., vol. 37, 1998, pp. 753-757.

(Continued)

*Primary Examiner*—Georgia Epps
*Assistant Examiner*—Davienne Monbleau
(74) *Attorney, Agent, or Firm*—Nixon & Vanderhye P.C.

(57) ABSTRACT

The presence or absence and the intensity of refractive index distribution are easily controlled with high reproducibility without depending on the fabricating process accuracy. InGaAs well layers (14a) and (14b), which have a narrow bandgap and a high refractive index, are enclosed by a lower barrier layer (13), an intermediate barrier layer (15), an upper barrier layer (16) and a buried layer (18) of GaAsN-based materials of a wide bandgap. Then, by adjusting the nitrogen crystal mixture ratio of the GaAsN-based materials that constitute the barrier layers (13), (15) and (16) and the buried layer (18), the presence or absence and the intensity of the refractive index distribution are controlled. Thus, the refractive index distribution is easily controlled with high reproducibility without considering the configuration of a diffraction grating (17), a refractive index balance with respect to the buried layer (18) and so on, i.e., without depending on the fabricating process accuracy.

10 Claims, 13 Drawing Sheets

U.S. PATENT DOCUMENTS 6,519,270 B1 *  2/2003  Kim et al. .................... 372/28
6,574,256 B1 *  6/2003  Hofstetter et al. ............ 372/45

FOREIGN PATENT DOCUMENTS

| | | |
|---|---|---|
| JP | 60-102788 | 6/1985 |
| JP | 5-29705 | 2/1993 |
| JP | 5-136527 | 6/1993 |
| JP | 5-145169 | 6/1993 |
| JP | 5-183236 | 7/1993 |
| JP | 6-7624 | 1/1994 |
| JP | 6-164051 | 6/1994 |
| JP | 7-45907 | 2/1995 |
| JP | 8-8394 | 1/1996 |
| JP | 8-37342 | 2/1996 |

OTHER PUBLICATIONS

Luo et al; "Purely Gain-Coupled Distributed Feedback Semiconductor Lasers"; Appl. Phys. Lett., vol. 56, No. 17, Apr. 23, 1990, pp. 1620-1622.

Duling et al; "Time-Dependent Semiclassical Theory of Gain-Coupled Distributed Feedback Lasers"; IEEE Journal of Quantum Electronics, vol. QE-20, No. 10, Oct. 1984, pp. 1202-1207.

"Effect of Misorientation on Characteristics of Gain/As/GaAs AQ Grown by MOVPE", Kikkawa et al.

"First Order Gain-Coupled GaInAs/GaAs Distributed Feedback Laser Diodes Patterned by Focused Ion Beam Implantation", Orth et al., Appl. Phys. Lett., vol. 69, No. 13, Sep. 23, 1996, pp. 1906-1908.

"Minimum Feature Sizes and Ion Beam Profile for a Focused Ion Beam System With Post-Objective Lens Retarding and Acceleration Mode", Kieslich et al., J. Vac. Sci. Technol., vol. 12, No. 6, Nov./Dec. 1994, pp. 3518-3522.

"Gain-Coupled DFB Lasers for Spectroscopic Application", Tohmon et al., Proceedings of the SPIE, vol. 3537, Nov. 1998, pp. 96-105.

* cited by examiner

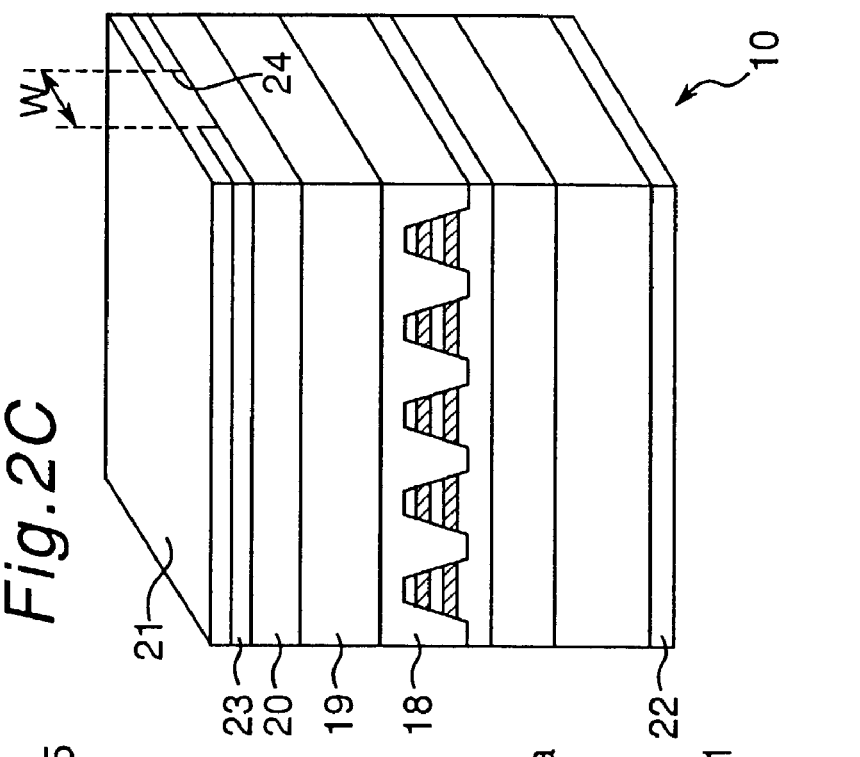
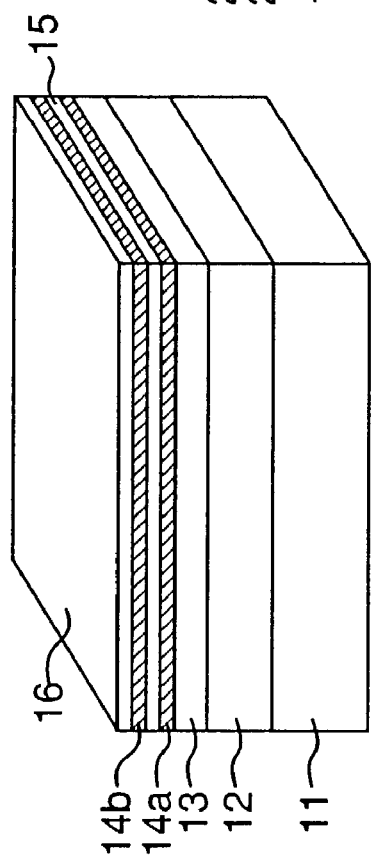
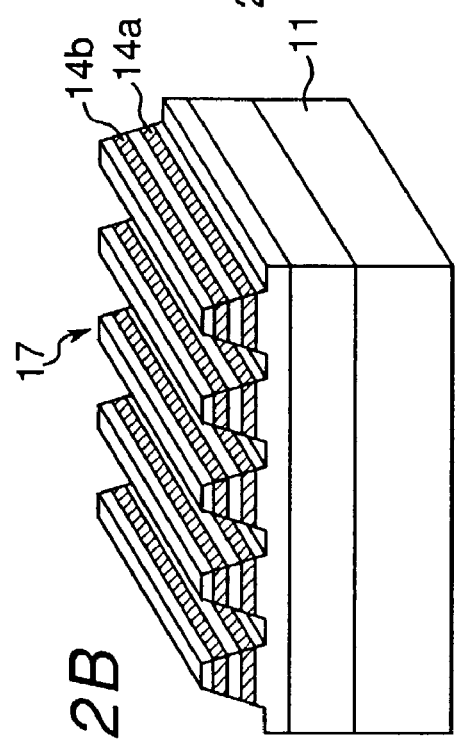

Fig.18
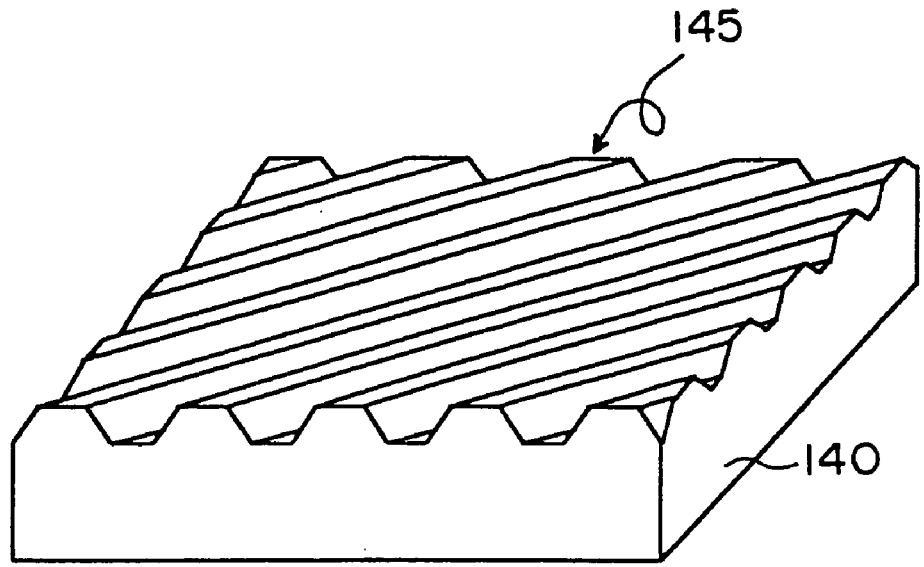
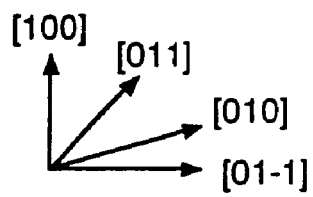
Fig.19 (PRIOR ART)
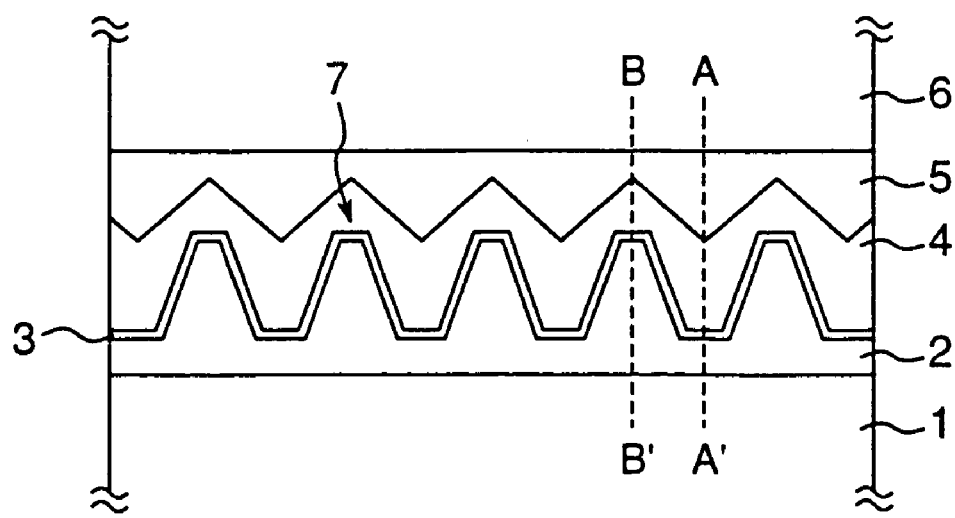

US 7,016,391 B2

GAIN-COUPLED DISTRIBUTED FEEDBACK SEMICONDUCTOR LASER DEVICE AND PRODUCTION METHOD THEREFOR

This application is the US national phase of international application PCT/JP01/00838 filed Jul. 2, 2001, which designated the US.

TECHNICAL FIELD

The present invention relates to a gain-coupled distributed-feedback type semiconductor laser device (hereinafter referred to simply as a GC-DFB-LD (Gain-Coupled Distributed-FeedBack Laser Diode)) which uses distributed feedback by gain coupling and a fabricating method therefor.

BACKGROUND ART

The GC-DFB-LD has various excellent features such as a satisfactory single longitudinal mode property and a resistance to return light inductive noise.

In order to effectuate gain coupling, mainly two methods have been proposed and their characteristics have been reported. As disclosed in a plurality of reports including Japanese Patent Laid-Open Publication No. SHO 60-102788 (first prior art example), a first method is to periodically change the optical gain in an active layer by periodically arranging the active layer itself of a semiconductor laser or providing the active layer itself with a periodic structure (gain diffraction grating). Moreover, as disclosed in a plurality of reports including Japanese Patent Publication No. HEI 6-7624 (second prior art example), a second method is to periodically change a mode gain by periodically arranging an optical absorption layer (absorptive diffraction grating) in the vicinity of the active layer of a semiconductor laser.

The semiconductor laser structures disclosed in the first prior art example and the second prior art example, which are the basic structures for periodically changing the gain, also have a refractive index periodically changed with the gain. That is, in the aforementioned prior art examples, gain coupling and refractive index coupling are intermixed. Therefore, the structures cannot make the best use of the excellent original performance of the gain coupling.

Further, a plurality of reports including Japanese Patent Laid-Open Publication No. HEI 5-136527 (third prior art example) discloses a structure, in which the periodic change of refractive index is canceled in the gain diffraction grating represented by the first prior art example. The structure of the essential part of the GC-DFB-LD disclosed in the third prior art is as shown in a longitudinal cross section in FIG. 19.

In FIG. 19, the material and the layer thickness of each layer are as follows.

Lower clad layer 1: n-type InP; 0.45 $\mu$m
Semiconductor layer 2: n-type InGaAsP; 0.2 $\mu$m
Buffer layer 3: n-type InP; 10 nm
Active layer 4: i (intrinsic)-InGaAsP; 0.1 $\mu$m
Guide layer 5: p-type InP; 1.2 $\mu$m
Upper clad layer 6: p-type InP; 1.2 $\mu$m This structure is obtained by laminating the lower clad layer 1 and the semiconductor layer 2 on an InP substrate through first-time crystal growth, thereafter forming a diffraction grating shaped corrugated configuration 7 on the surface of the semiconductor layer 2 by a two-beam interference exposure method and an etching technique and laminating the layers of the buffer layer 3 up to the upper clad layer 6 on the semiconductor layer 2 through second-time crystal growth.

In this case, the active layer 4 has a periodic structure under the influence of the corrugated configuration 7 of the semiconductor layer 2 of its groundwork, and this modulates the gain, causing gain coupling. On the other hand, refractive index distribution is increased in order of the guide layer 5, the semiconductor layer 2 and the active layer 4 by material selection. As a result, in a region A–A' in FIG. 19, the active layer 4 of a large refractive index has a large volume, and the guide layer 5 of a small refractive index also has a large volume. Therefore, the large refractive index of the active layer 4 is canceled. On the other hand, in a region B–B', the active layer 4 of a large refractive index has a small volume, and the guide layer 5 of a small refractive index accordingly has a small volume. Thus, by controlling the corrugated configuration 7 of the semiconductor layer 2, the post-burial configurations of the active layer 4 and the guide layer 5, which bury it, and the refractive indexes of the layers, it is enabled to achieve a balance so that an equivalent refractive index becomes constant not only in the regions A–A' and B–B' but also in arbitrary regions. Thus, a GC-DFB-LD, which substantially has no refractive index coupling, can be obtained.

Furthermore, a plurality of reports including Japanese Patent Publication No. HEI 8-8394 (fourth prior art example) and Japanese Patent Laid-Open Publication No. HEI 5-29705 (fifth prior art example) disclose structures for canceling the periodic change of refractive index in the absorptive layer in an absorptive diffraction grating represented by the second prior art example.

In the aforementioned third through fifth prior art examples, a refractive index perturbation caused by the provision of the corrugated configuration in the active layer or the absorptive layer is canceled by providing an anti-phase refractive index perturbation in the neighborhood. The GC-DFB-LD, which substantially contains no refractive index coupling component, is called the intrinsic GC-DFB-LD.

However, the aforementioned third through fifth prior art examples have the following problems. That is, in the aforementioned third through fifth prior art examples, the refractive index distribution is canceled by the well-balanced provision of the anti-phase refractive index distribution for the active layer or the absorptive layer having the corrugated configuration. This theoretically requires an extremely high processing accuracy in controlling the corrugated configurations of the gain diffraction grating and the absorptive diffraction grating as well as the burial configuration of the buried layer. That is, the perturbation of the equivalent refractive index disadvantageously largely changes even with a little change in the diffraction grating and burial configurations, and this disadvantageously puts the refractive index distribution canceling balance into disorder.

Moreover, a plurality of devices are normally collectively fabricated in a wafer. In the above case, it is difficult to avoid the influences of the variations in shape of the diffraction gratings in the wafer and the variations in shape occurring every production lot, and a thorough process management is indispensable in order to obtain the intrinsic GC-DFB-LD.

DISCLOSURE OF THE INVENTION

Accordingly, the object of this invention is to provide a GC-DFB-LD capable of easily controlling the presence or absence of and the intensity of a refractive index distribution with high reproducibility without depending on the fabricating process accuracy, and a fabricating method therefor.

In order to achieve the above object, there is provided a gain-coupled distributed-feedback type semiconductor laser device having a prescribed refractive index and a prescribed bandgap, the device comprising:

a first layer having a periodic structure; and a second layer, which has a refractive index approximately equal to a refractive index of the first layer and a bandgap wider than a bandgap of the first layer and in which the periodic structure of the first layer is buried flat.

According to the above-mentioned construction, the periodic structure is formed in the first layer that has a bandgap narrower than that of the second layer, and therefore, gain coupling is provided when the first layer is made to function as a light-emitting layer or an absorptive layer. On the other hand, the first layer and the second layer, in which the periodic structure of this first layer is buried flat, have approximately equal refractive indexes, and therefore, no refractive index coupling component is owned. That is, the GC-DFB-LD of this invention functions as an intrinsic GC-DFB-LD. Furthermore, the periodic structure of the first layer, which is merely buried flat in the second layer, is therefore formed without utterly depending on the fabricating process accuracy.

In one embodiment of the present invention, a laminate structure, which includes the first layer and the second layer, has a refractive index coupling coefficient $\kappa_i$ of not greater than 5 cm$^{-1}$.

According to the above-mentioned construction, the refractive index coupling coefficient $\kappa_i$ of the laminate structure that includes the first layer and the second layer, in which the periodic structure of this first layer is buried flat, is not greater than 5 cm$^{-1}$. Therefore, the influence of the refractive index coupling component is sufficiently small, and the refractive indexes of both the layers are considered to be approximately equal to each other.

In one embodiment of the present invention, the first layer emits induced emission light, and the second layer is provided closely to the first layer and contains nitrogen.

According to the above-mentioned construction, the second layer, which has a bandgap wider than that of the first layer and is transparent with respect to the induced emission light from the first layer, is provided closely around the periphery of the first layer, which has the periodic structure and emits the induced emission light. Thus, the confinement of carriers in the first layer is efficiently achieved. Furthermore, the periodic structure of the second layer is formed closely to the first layer. Therefore, by adjusting the nitrogen crystal mixture ratio of the second layer, the intensity of the periodic change of the equivalent refractive index in the laminate structure that includes the first and second layers can be controlled. Therefore, in the gain diffraction grating type GC-DFB-LD, the intensity of the periodic change of the refractive index can easily be controlled with high reproducibility without considering the shape and so on of the first and second layers, i.e., without depending on the fabricating process accuracy.

One embodiment of the present invention further comprises:

a third layer for generating induced emission light, the first layer being located in the vicinity of one surface of the third layer, absorbing the induced emission light generated from the third layer, and the second layer being provided closely to the first layer and containing nitrogen.

According to the above-mentioned construction, the second layer, which has a bandgap wider than that of the first layer and is transparent with respect to the induced emission light from the third layer, is provided closely around the periphery of the first layer, which has the periodic structure and emits the induced emission light. Thus, the periodic structure of the second layer is formed. Therefore, by adjusting the nitrogen crystal mixture ratio of the second layer, the intensity of the periodic change of the equivalent refractive index in the laminate structure that include the first and second layers can be controlled. Therefore, in the absorptive diffraction grating type GC-DFB-LD, the intensity of the periodic change of the refractive index can easily be controlled with high reproducibility without considering the shape and so on of the first and second layers, i.e., without depending on the fabricating process accuracy.

In one embodiment of the present invention, the multi-layer structure constructed of the first layer and the second layer has a flat surface.

According to the above-mentioned construction, the periodic structure of the first layer is buried in the second layer, and the surface of the multi-layer structure constructed of the first layer and the second layer is a flat surface. Therefore, the intensity of the periodic change of the refractive index set by adjusting the nitrogen crystal mixture ratio is not changed by the surface configuration of the multi-layer structure.

In one embodiment of the present invention, the second layer contains at least one of indium and antimony at a prescribed crystal mixture ratio. According to the above-mentioned construction, the second layer contains at least one of indium and antimony at a prescribed crystal mixture ratio. Therefore, a change in the lattice constant occurring when the refractive index is adjusted by mixing the second layer crystallinically with an appropriate amount of nitrogen is canceled by the crystallinic mixture of In or Sb. Thus, an intrinsic GC-DF B-LD, which has more excellent characteristics, is obtained.

In one embodiment of the present invention, the first layer is formed while being crystallinically grown on a surface whose plane direction extends in a (100) plane or a surface crystallographically equivalent to the (100) plane, and the periodic structure is formed in a [010] direction or a [00-1] direction or a direction crystallographically equivalent to the [010] or [00-1] direction.

According to the above-mentioned construction, when the second layer mixed crystallinically with nitrogen is crystallinically grown on the periodic structure of the first layer, the crystallinic mixture of nitrogen in the growing layer becomes uniform without receiving the influence of the corrugation of the groundwork, and the control of the refractive index coupling coefficient is performed more accurately. Thus, an intrinsic GC-DFB-LD, which has more excellent characteristics, is obtained.

There is also provided a gain-coupled distributed-feedback type semiconductor laser device fabricating method comprising the steps of:

forming a first layer having a periodic structure of a group III–V compound semiconductor; and forming a second layer of a group III–V compound semiconductor, which has a bandgap wider than that of the first layer and contains nitrogen, so that the periodic structure of the first layer is buried flat.

According to the above-mentioned construction, the first layer, which has the periodic structure, is formed of the group III–V compound semiconductor, therefore functions as a light-emitting layer when placed between the p/n reverse conducting type clad layers or functions as an absorptive layer when buried in a p-type or n-type clad layer. Then, the second layer, which has a wider bandgap and is constructed of the group III–V compound semiconductor, is formed closely to the light-emitting layer or the absorptive layer that has this periodic structure. Therefore, by forming the periodic structure in the second layer and adjusting the nitrogen crystal mixture ratio of the second layer, the intensity of the periodic change of the equivalent refractive index in the laminate structure including the first and second layers can be controlled. Thus, the intensity of the periodic change of the refractive index can easily be controlled with high reproducibility without depending on the fabricating process accuracy.

In one embodiment of the present invention, the second layer is formed by being crystallinically grown at a growth rate of not higher than 1 μm/hour.

According to the above-mentioned construction, the second layer, in which the periodic structure of the first layer is buried flat, is crystallinically grown at a growth rate of not higher than 1 μm/hour. With this arrangement, the surface diffusion of the raw material seed that includes nitrogen is sufficiently performed in the second layer, and the periodic distribution of the nitrogen crystal mixture ratio attributed to the periodic structure disappears. Therefore, the refractive index distribution in the second layer becomes more uniform. Furthermore, the flattening of the surface of the second layer is promoted, and the periodic structure of the first layer is buried more flatly.

In one embodiment of the present invention, the second layer has a refractive index approximately equal to a refractive index of the first layer.

According to the above-mentioned construction, the periodic structure is formed in the first layer, which functions as the light-emitting layer or the absorptive layer, providing gain coupling. On the other hand, the first layer and the second layer located closely to the first layer have refractive indexes approximately equal to each other, and therefore, no refractive index coupling component is owned. That is, an intrinsic GC-DFB-LD is easily formed with high reproducibility without depending on the fabricating process accuracy.

In one embodiment of the present invention, a laminate structure, which include the first layer and the second layer, has a refractive index coupling coefficient $\kappa_i$ of not greater than 5 cm$^{-1}$.

According to the above-mentioned construction, the periodic structure is formed in the first layer, which functions as the light-emitting layer or the absorptive layer, providing gain coupling. On the other hand, the refractive index coupling coefficient $\kappa_i$ of the laminate structure that includes the first and second layers is not greater than 5 cm$^{-1}$. Therefore, the refractive indexes of both the layers are considered to be approximately equal to each other, and the influence of the refractive index coupling component becomes sufficiently small. That is, an intrinsic GC-DFB-LD is easily formed with high reproducibility without depending on the fabricating process accuracy.

In one embodiment of the present invention, the second layer has a refractive index set by adjusting the crystal mixture ratio of nitrogen.

According to the above-mentioned construction, the refractive index of the second layer is easily controlled with high reproducibility merely by adjusting the nitrogen crystal mixture ratio of the second layer and is allowed to be set approximately equal to the refractive index of the first layer.

In one embodiment of the present invention, the first layer is formed by being crystallinically grown on a surface whose plane direction extends in a (100) plane or a surface crystallographically equivalent to the (100) plane, and forming the periodic structure in a [010] direction or a [00-1] direction or a direction crystallographically equivalent to the [010] or [00-1] direction.

According to the above-mentioned construction, when the second layer mixed crystallinically with nitrogen is crystallinically grown on the periodic structure of the first layer, the nitrogen crystal mixture ratio in the growing layer becomes uniform without receiving the influence of the corrugation of the groundwork, and the control of the refractive index coupling coefficient is performed more accurately. That is, the intensity of the periodic change of the refractive index can easily be controlled with high reproducibility and controllability.

BRIEF DESCRIPTION OF THE DRAWINGS

FIGS. 2A, 2B and 2C are perspective views of a laminate structure during the forming processes of the GC-DFB-LD shown in FIG. 1;

FIG. 18 is a perspective view of a laminate structure obtained after a diffraction grating is engraved during the forming process of the GC-DFB-LD shown in FIG. 17; and FIG. 19 is a longitudinal sectional view of an essential part of a prior art GC-DFB-LD.

BEST MODE FOR CARRYING OUT THE INVENTION

Figure 1:
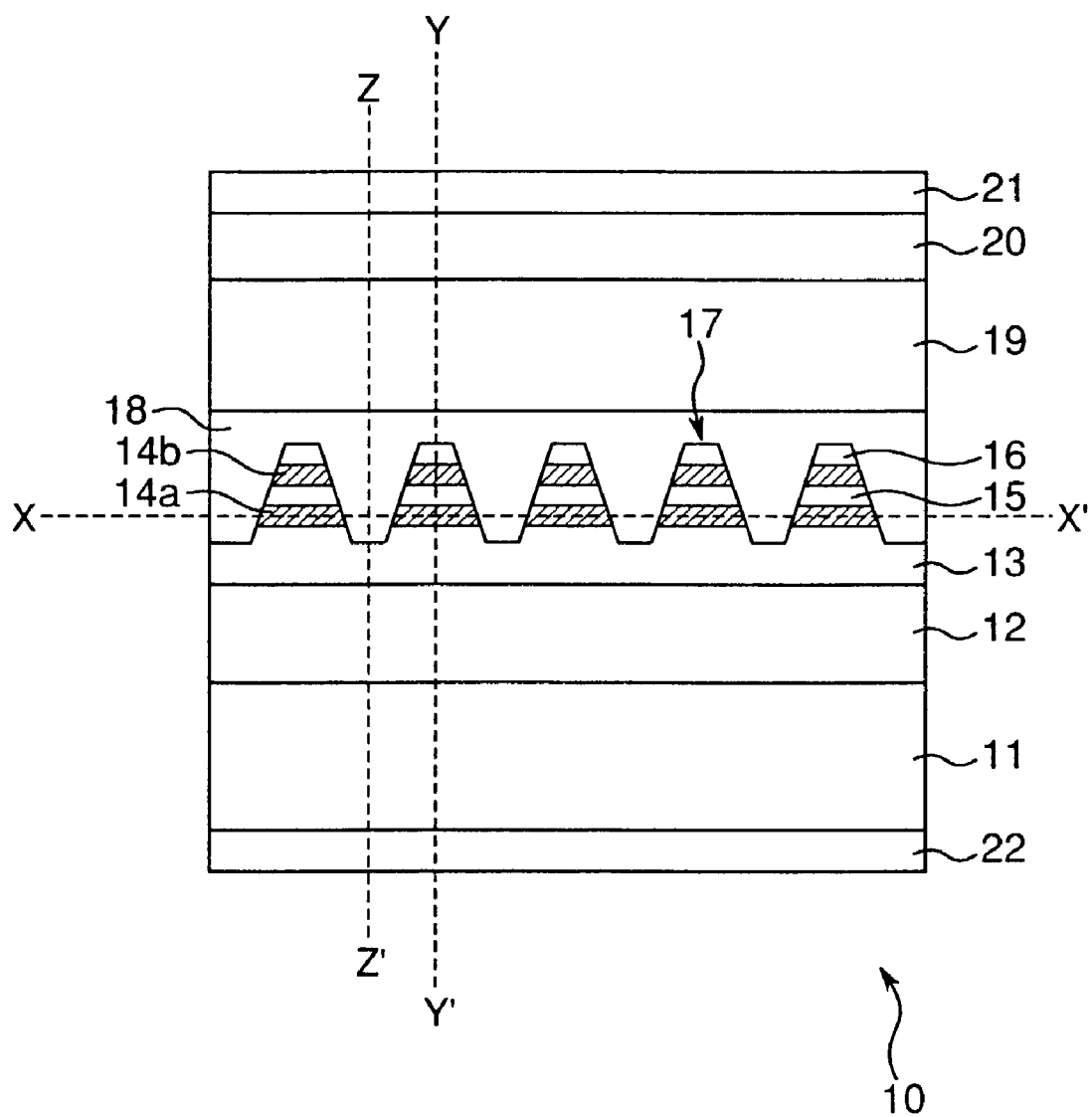
FIG. 1 is a longitudinal sectional view of a GC-DFB-LD of this invention.

The present invention will be described in detail below on the basis of the embodiments shown in the drawings.

First Embodiment

The present embodiment is related to a gain diffraction grating type GC-DFB-LD characterized in that an intrinsic GC-DFB-LD is obtained by forming a transparent layer, which is located adjacent to well layers (light-emitting layers) formed periodically and mixed crystallinically with a small amount of nitrogen.

FIG. 1 schematically shows the cross-sectional structure of the gain diffraction grating type GC-DFB-LD of the present embodiment. The structure, the material and the layer thickness of each portion are as follows.

Substrate 11:
　n-type GaAs; 100 μm
Lower clad layer 12:
　n-type $Al_{0.3}Ga_{0.7}As$; 1.0 μm
Lower barrier layer 13:
　i-$GaAs_{0.9952}N_{0.0048}$; 70 nm (thickest portion)
Well layer 14:
　i-$In_{0.2}Ga_{0.8}As$; 10 nm
Intermediate barrier layer 15:
　i-$GaAs_{0.9952}N_{0.0048}$; 20 nm
Upper barrier layer 16:
　i-$GaAs_{0.9952}NO_{0.0048}$; 20 nm
Buried layer 18:
　i-$GaAs_{0.9952}N_{0.0048}$; 50 nm (thinnest portion)
Upper clad layer 19:
　p-type $Al_{0.3}Ga_{0.7}As$; 1.0 μm
Contact layer 20:
　$p^+$-GaAs; 0.5 μm
P-electrode metal 21:
　AuZn
N-electrode metal 22:
　AuGe/Ni The GC-DFB-LD 10, which has the above-mentioned structure, is formed as follows. FIGS. 2A–2C are perspective views of a laminate structure during the forming process of the GC-DFB-LD 10 shown in FIG. 1. The method for fabricating the GC-DFB-LD 10 shown in FIG. 1 will be described below with reference to FIG. 2.

First of all, as shown in FIG. 2A, the layers of the lower clad layer 12 to the upper barrier layer 16 are successively laminated on an n-type GaAs substrate 11 through first-time crystal growth using the metal-organic vapor deposition method. In the above case, the (100) plane of the n-type GaAs substrate 11 is used. According to the metal-organic vapor deposition method, there were used trimethylaluminum, trimethylgallium, trimethylindium, arsine and dimethylhydrazine as the raw materials of Al, Ga, In, As and N, respectively. The laminate structure, which has thus undergone the first-time crystal growth, is taken out of the crystal growth chamber, and a grating-shaped photoresist mask (not shown) having a cycle of 0.28 μm and a duty ratio of 0.5 is formed on its surface by the two-beam interference exposure method.

Next, by an etchant obtained by mixing hydrochloric acid with a hydrogen peroxide aqueous solution at a ratio of 1:50 and diluting the mixture with five parts of pure water, regions where the photoresist mask is not formed are etched by a thickness of 75 nm from the surface. In the above case, the upper barrier layer 16 has a film thickness of 20 nm, the well layers 14a and 14b have a film thickness of 10 nm and the intermediate barrier layer 15 has a film thickness of 20 nm. Therefore, a total film thickness of the upper barrier layer 16 to the lower well layer 14a is 60 nm. Therefore, when the photoresist mask is removed, as shown in FIG. 2B, a diffraction grating 17, in which the two layers of the well layers 14a and 14b are periodically divided in the direction in which the n-type GaAs substrate 11 extends, is obtained.

Next, the laminate structure shown in FIG. 2B is put again into the crystal growth chamber, and the layers of the buried layer 18 to the contact layer 20 are grown on the diffraction grating 17 through second-time crystal growth as shown in FIG. 2C. In the above case, the buried layer 18 is required to undergo the crystal growth by selecting the crystal growth conditions so that the nitrogen distribution in the buried layer 18 becomes uniform and an interface between the buried layer 18 and the upper clad layer 19 becomes flat. The laminate structure, which has thus undergone the second-time crystal growth, is taken out of the crystal growth chamber, and a current constriction layer 23 of silicon nitride is formed on its surface as shown in FIG. 2C. A stripe-shaped aperture 24 of a width W (=5 μm) is formed in a direction orthogonal to the direction in which the diffraction grating 17 extends by the normal photolithography and wet etching. Finally, as shown in FIG. 2C, the p-electrode 21 is formed on the upper surface of the laminate structure, and the n-electrode 22 is formed on the lower surface. Then, by cleaving the laser light-emitting end surface, the gain diffraction grating type GC-DFB-LD 10 is obtained.

Figure 3:
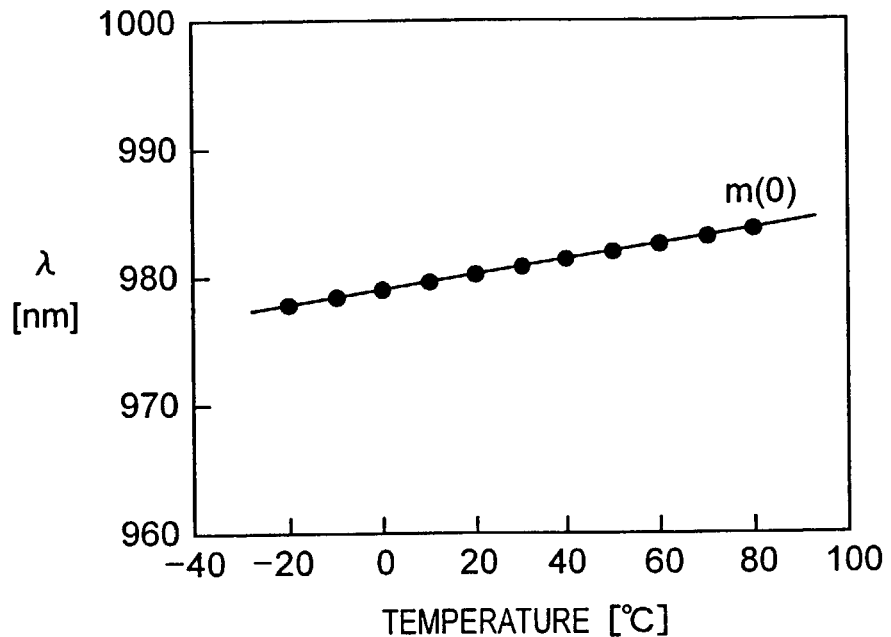
FIG. 3 is a graph showing the temperature dependency of the oscillation wavelength of the GC-DFB-LD shown in FIG. 1.

As the result of flowing a current through the p-electrode 21 and the n-electrode 22 of the gain diffraction grating type GC-DFB-LD 10 obtained as described above, oscillation occurred at a single wavelength of 980 nm at a threshold current density of 0.5 kA/cm². FIG. 3 shows the temperature dependency of the oscillation wavelength of this GC-DFB-LD 10. In FIG. 3, it can be understood that the oscillation occurs at a complete single wavelength at a device temperature of −20° C. to +80° C. at a sub-mode suppression ratio of not lower than 20 dB in an identical longitudinal mode (m(0)). Moreover, it was discovered that no stop band was observed in the oscillation spectrum and the refractive index coupling component was zero.

Moreover, as the result of examining the oscillation spectrum of a plurality of gain diffraction grating type GC-DFB-LD's 10 obtained from one wafer, it was discovered that the single wavelength oscillation occurred with a probability of 98% despite the fact that no antireflection coating was provided on the laser light-emitting end surface, and this showed that the single wavelength laser fabrication yield was very high. These features are the characteristics peculiar to the intrinsic GC-DFB-LD that includes no refractive index coupling component.

FIRST COMPARATIVE EXAMPLE

There was fabricated a gain diffraction grating type GC-DFB-LD 10, in which the materials of only the lower barrier layer 13, the intermediate barrier layer 15, the upper barrier layer 16 and the buried layer 18 were changed from i-GaAsN to i-GaAs and the materials of other layers were made quite same on the basis of the structure of the GC-DFB-LD of the first embodiment.

Figure 4:
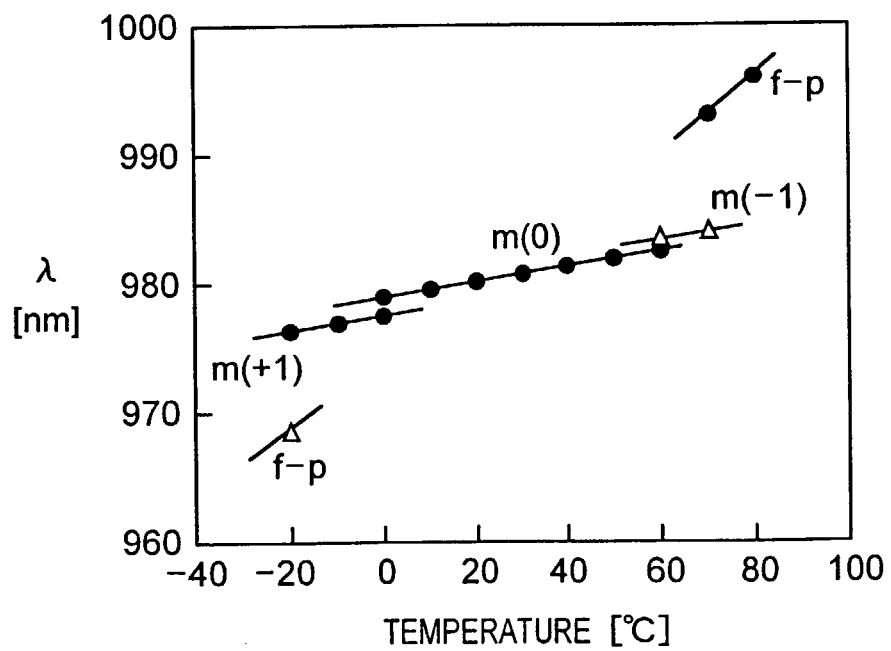
FIG. 4 is graph showing the temperature dependency of the oscillation wavelength of the GC-DFB-LD of a first comparative example.

The GC-DFB-LD of this first comparative example also oscillated at a single wavelength of 980 nm at a threshold current density of 0.5 kA/cm². FIG. 4 shows the typical example of the temperature dependency of the oscillation wavelength of this GC-DFB-LD. In FIG. 4, oscillation occurs in the single longitudinal mode (m(0)) at a device temperature of +10° C. to +50° C. However, when the device temperature was set lower than +10° C. or higher than +50° C., there were observed a mode hop that the oscillation shifts to oscillation in another adjacent longitudinal mode (m(+1), m(−1)) and oscillation in a Fabry-Perot mode (f-p), and instability of the oscillation wavelength occurred. Moreover, it was discovered that a stop band existed in the oscillation spectrum, and the gain coupling and the refractive index coupling coexisted to cause the instability of the oscillation wavelength.

Moreover, as the result of examining the oscillation spectrum of a plurality of GC-DFB-LD's for comparison use obtained from one wafer, it was discovered that the single wavelength oscillation occurred with a probability of 65% at a room temperature in a state in which no antireflection coating was provided on the laser light-emitting end surface. It was discovered that the single wavelength laser fabrication yield was low in comparison with the case of the first embodiment where the transparent layer with which a small amount of nitrogen was crystallinically mixed was formed adjacently to the well layer.

The operation and effects of the first embodiment will be described in detail below according to the first embodiment and the first comparative example.

The present first embodiment is characterized in that the barrier layer, which has a wide bandgap and is located adjacent to the InGaAs well layer 14, which is divided periodically into parts like the diffraction grating 17, is constructed while being mixed crystallinically with a minute amount (0.48% in the first embodiment) of nitrogen. That is, by mixing the barrier layer crystallinically with a minute amount of nitrogen, the refractive index is adjusted to a prescribed value without largely changing the bandgap. This fact will be described with reference to FIGS. 5A, 5B and FIGS. 6A, 6B.

Figure 5A:
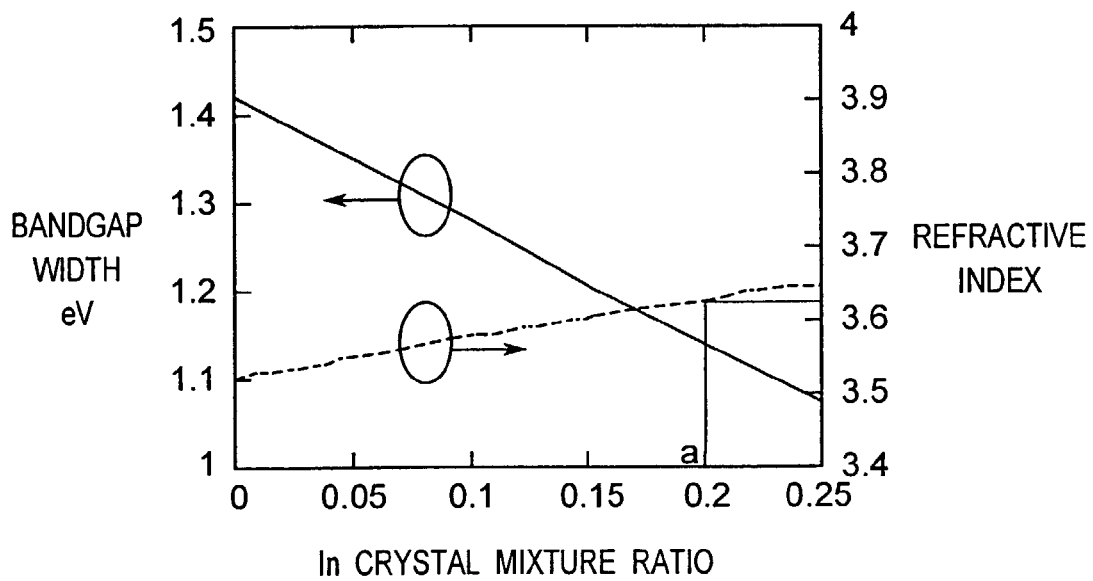
FIGS. 5A and 5B are graphs showing changes in refractive index and bandgap when GaAs is mixed crystallinically with In or N.
Figure 5B:
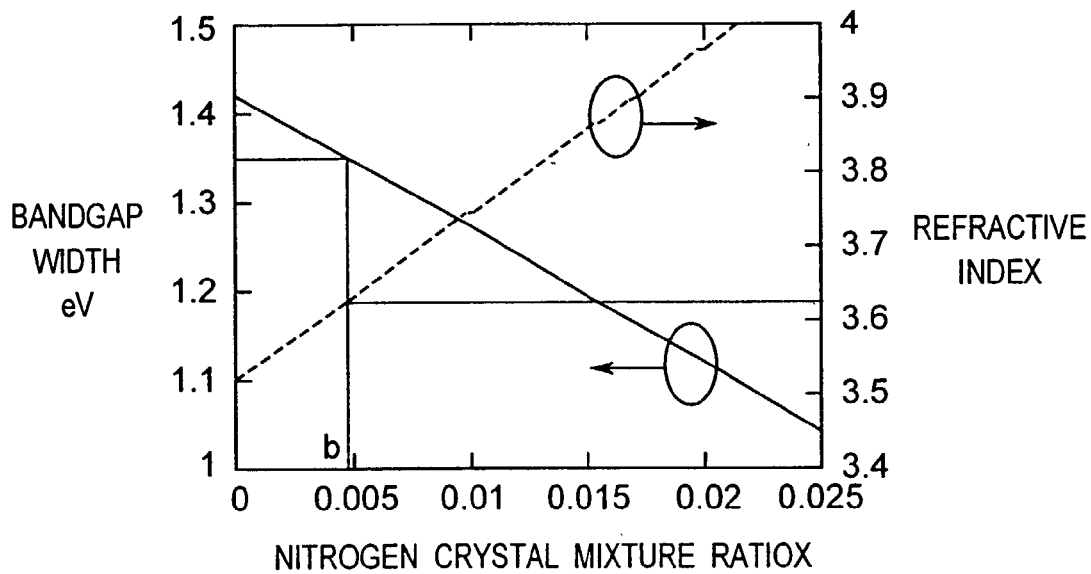

FIG. 5A shows a state of change in the refractive index and the bandgap when GaAs is mixed crystallinically with In. FIG. 5B shows a state of change in the refractive index and the bandgap when GaAs is mixed crystallinically with N. FIG. 5A and FIG. 5B show that $In_{0.2}Ga_{0.8}As$ (point "a" in FIG. 5A) employed for the well layer 14 and $GaAs_{0.9952}N_{0.0048}$ (point "b" in FIG. 5B) employed for the barrier layers 13, 15 and 16 and the buried layer 18 located adjacent to the well layer 14 have same refractive index in the first embodiment. In contrast to this, it can be understood that the $GaAs_{0.9952}N_{0.0048}$ employed for the barrier layers 13, 15 and 16 and the buried layer 18 has a bandgap of about 1.35 eV from FIG. 5B and is transparent with respect to the emission wavelength of 980 nm from the well layer 14. That is, as is apparent from FIG. 6A that shows the band diagram and the distribution of the refractive index $n_{eq}$ in the direction of the resonator (in the direction of X–X' in FIG. 1), the active region in the first embodiment has no periodic structure in the equivalent refractive index $n_{eq}$ despite the fact that it has a periodic structure in the bandgap.

That is, the well layer 14, in which the bandgap is narrow, is enclosed by the barrier layers 13, 15 and 16 and the buried layer 18, which are transparent and in which the bandgap is wide. Therefore, the barrier layers 13, 15 and 16 and the buried layer 18 all have the same refractive index in spite of the gain diffraction grating whose gain regions are periodically formed, and the perturbation of equivalent refractive index does not occur at all.

Therefore, in the first embodiment, there is no need for considering the configuration of the diffraction grating 17, the balance of refractive index with respect to the buried layer 18 and so on, dissimilarly to the case of the conventional structure in which the refractive index perturbation of the active layer is canceled by the anti-phase refractive index perturbation provided in the neighborhood. No refractive index coupling substantially occurs so long as the diffraction grating 17 is buried flat, and the intrinsic GC-DEB-LD can easily be obtained.

Figure 6A:
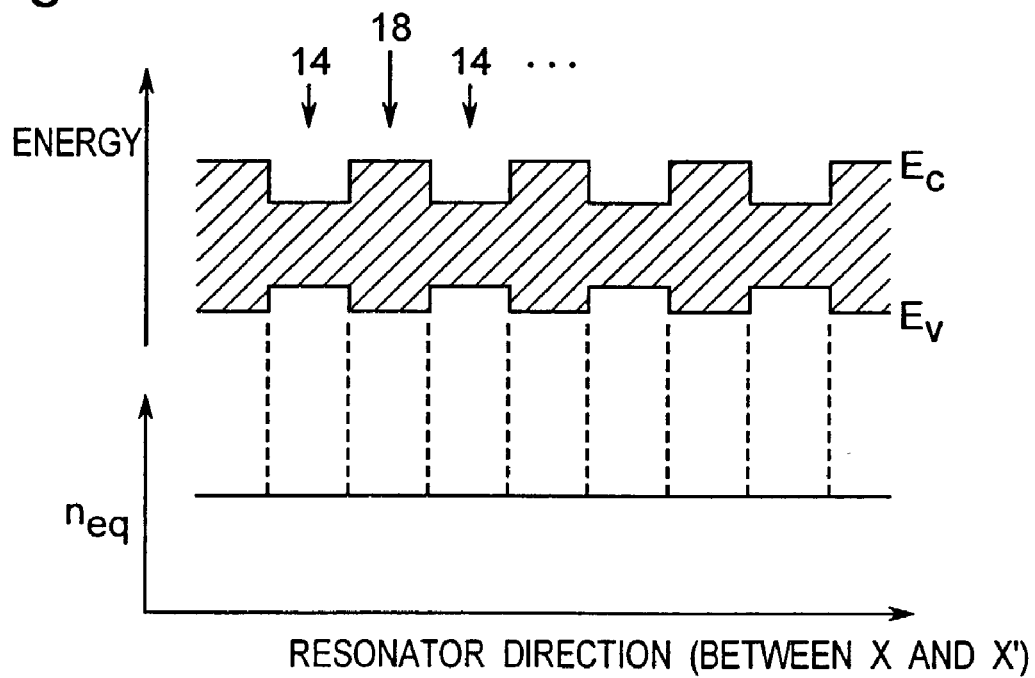
FIGS. 6A and 6B are graphs showing a band diagram and an equivalent refractive index distribution in the resonator direction of the GC-DFB-LD of FIG. 1 or the first comparative example.
Figure 6B:
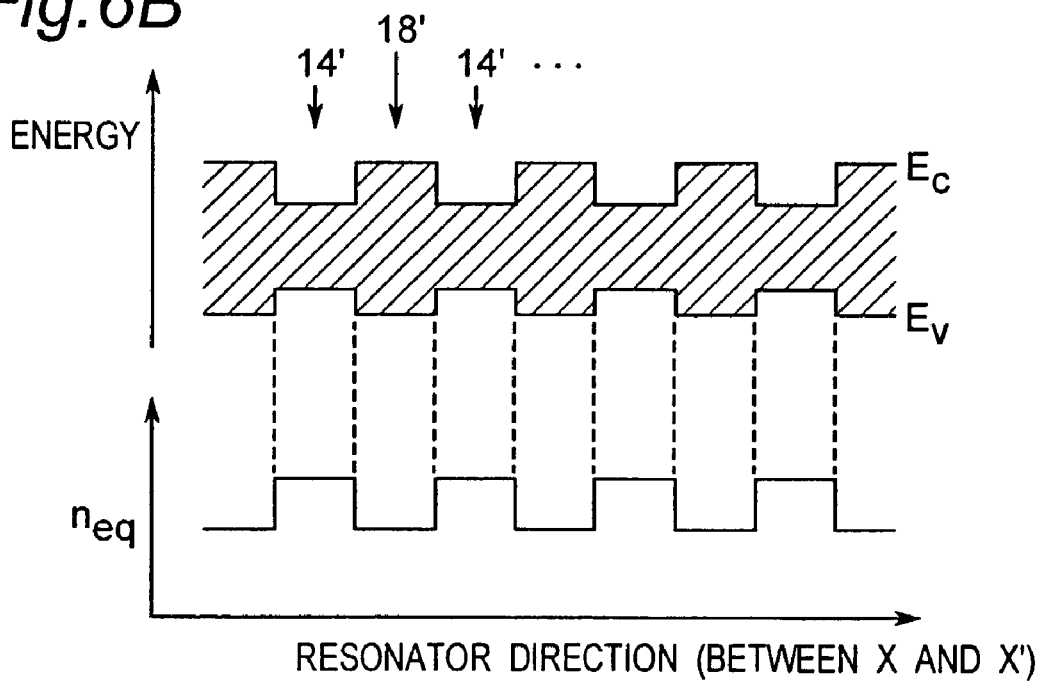

In contrast to this, in the first comparative example, a layer 18', which is located around a well layer 14' of a narrow bandgap, is not mixed crystallinically with nitrogen. Therefore, as shown in FIG. 6B, the equivalent refractive index $n_{eq}$ also periodically changes in synchronization with the periodic change of the band structure in the active region.

Normally, the group III–V compound semiconductor has such a relation that the refractive index becomes high when the bandgap becomes narrow. Moreover, the rate of change in the above case is on the same level substantially not depending on the material system. For example, in InGaAs-based mixed crystals, the rate of change of the refractive index due to a change in the bandgap when the crystal mixture ratio of In is changed is about 0.4 [per eV]. Also, in the case of AlGaAs-based mixed crystals, the rate of change of the refractive index when the crystal mixture ratio of Al is changed is about 0.4 [per eV].

Therefore, when a gain diffraction grating is produced with these material systems and the heterojunction of them as in the case of the first comparative example, the refractive index of the active layer (well layer) portion, in which the bandgap is the narrowest, comes to have the highest refractive index, and the refractive index becomes low in the surrounding barrier layer portion, in which the bandgap is comparatively wide, meaning that the refractive index perturbation cannot be avoided.

However, in the first embodiment, the barrier layers 13, 15 and 16 and the buried layer 18 are slightly mixed crystallinically with nitrogen. In this GaAsN mixed crystal system, the rate of change of the refractive index when the nitrogen crystal mixture ratio is changed is about 1.4 [per eV], and this means that the rate of change of the refractive index is several times greater than that of the other material systems. That is, by slightly mixing GaAs crystallinically with N, as shown in FIG. 5B, the GaAsN mixed crystal system can be regarded as a special mixed crystal system, which can obtain a material of a very high refractive index while maintaining the bandgap comparatively wide since the influence of an increase in the refractive index is large although the bandgap is slightly reduced. The first embodiment positively utilizes the rate of change of the refractive index peculiar to the material with which a small amount of nitrogen is crystallinically mixed. By enclosing the InGaAs well layer that has a narrow bandgap and a high refractive index with the GaAsN-based material that has a wide bandgap and adjusting the nitrogen crystal mixture ratio of the GaAsN-based material, the structure of a diffraction grating in which no refractive index distribution occurs is obtained.

If crystal growth is performed under inappropriate crystal growth conditions when the buried layer 18 mixed crystallinically with nitrogen is crystallinically grown on the diffraction grating 17 in the structure of a gain diffraction grating type GC-DFB-LD 10 as shown in FIG. 1, then a nitrogen crystal mixture ratio distribution sometimes occurs in accordance with the corrugated configuration of the diffraction grating 17. This is attributed to the fact that the plane direction dependency of the groundwork crystals is large with respect to the incorporation rate of nitrogen into the crystalline film during the crystal growth. That is, the crystallographic plane direction differs between the flat portions of the ridge and groove and the inclined portions exposed by etching of the corrugated configuration of the diffraction grating 17 shown in FIG. 1. If the layer mixed crystallinically with nitrogen is crystallinically grown on the groundwork that has different plane directions as described above, then a periodic distribution occurs in the nitrogen crystal mixture ratio depending on the plane directions of the groundwork.

In more concrete, nitrogen is easily taken into the surface inclined from the (100) plane in the [011] direction and hardly taken into the surface inclined in the [01-1] direction. Therefore, the nitrogen crystal mixture ratio distribution periodically occurs in the buried layer 18 located on the diffraction grating 17 where the plurality of surfaces periodically appear repetitively. As described above, if a nitrogen crystal mixture ratio distribution occurs in the buried layer 18, then a refractive index distribution, which coincides with the cycle of the corrugated configuration of the diffraction grating 17 that is the groundwork, occurs inside the buried layer 18. In the above case, the object of the present embodiment to obtain a diffraction grating structure in which no refractive index distribution occurs by adjusting the nitrogen crystal mixture ratio cannot be achieved.

The present inventor discovered that setting the growth rate during the crystal growth to a sufficiently slow rate of not higher than 1 $\mu$m/hour was effective in order to eliminate the nitrogen crystal mixture ratio distribution during the grown crystal according to the corrugated configuration of the groundwork crystals as described above. This is presumably ascribed to the fact that the surface diffusion of the raw material seed supplied during the crystal growth sufficiently occurs when the growth rate is sufficiently slow and the atoms that constitute the crystals are sufficiently mixed randomly.

As described above, to sufficiently cause the surface diffusion of the raw material seed by sufficiently slowing down the growth rate produces an effect also in promoting the flattening of the upper surface of the buried layer 18. That is, the crystal growth progresses in turn before the surface diffusion of the raw material seed sufficiently occurs if the growth rate is too fast, and therefore, the flattening is not promoted with the initial corrugation maintained also after the crystal growth. In order to promote this flattening, the sufficiently slow growth rate of not higher than 1 $\mu$m/hour is essential.

The present embodiment can be achieved by developing a technique for growing crystals, which have a uniform nitrogen crystal mixture ratio distribution on the groundwork that has a corrugated configuration and have sufficiently flattened surfaces. The above-mentioned fact holds not only in the case of the GaAsN material of the present embodiment but also in other material systems described in connection with the following embodiments. Moreover, the same thing can be said for other crystal growth methods, other kinds of raw materials and so on.

It is often the case where GaAs is employed as a barrier layer for the InGaAs well layer. In the first embodiment, GaAsN, which has a slightly narrower bandgap, is employed for the barrier layers 13, 15 and 16 and the buried layer 18 in place of GaAs. Accordingly, there is concern about a reduction in the band offset with respect to the well layer. However, since a conduction band discontinuity ($\Delta E_c$) is about 160 meV when $GaAs_{0.9952}N_{0.0048}$ is employed as the barrier layers 13, 15 and 16 and the buried layer 18 for the $In_{0.2}Ga_{0.8}As$ well layer 14, and the valence band discontinuity ($\Delta E_v$) is about 50 meV. Therefore, it can be said that the carrier confinement in the well layer 14 is sufficiently achieved. Even in the actual GC-DFB-LD 10, the characteristic temperature indicated a sufficient value of about 110 K.

Moreover, since GaAsN is employed as the barrier layers 13, 15 and 16 and the buried layer 18 in place of GaAs, there appears concern about the occurrence of lattice defect as a consequence of the deviation of the lattice constant of the barrier layer from the lattice constant of the GaAs substrate 11 due to the above fact. However, the deviation of $GaAs_{0.9952}N_{0.0048}$ from GaAs in terms of lattice constant has a small value $\Delta a$ of about 0.1% at most, and it can be said that the lattice defect does not occur even when GaAsN is employed for the barrier layers 13, 15 and 16 and the buried layer 18 in place of GaAs. The actual GC-DFB-LD 10 had a sufficient device operating life of not shorter than 5000 hours at a device temperature of 80° C. with an output of 10 mW.

The present embodiment is described taking the intrinsic GC-DFB-LD, in which the periodic fluctuation of the equivalent refractive index is zero, as an example. In spite of the description that "the periodic fluctuation of the equivalent refractive index is zero" provided herein, it is a matter of course that the periodic fluctuation of the equivalent refractive index substantially has no problem even if it is not completely zero so long as the periodic fluctuation is small to the extent that the influence of the refractive index coupling on the gain coupling becomes sufficiently small. According to the results of examination conducted by the present inventor, it was discovered that the influence of the refractive index coupling was able to be reduced in the case of the periodic fluctuation of the equivalent refractive index such that the refractive index coupling coefficient $\kappa_i$, which represents the degree of refractive index coupling caused by the periodic fluctuation of the refractive index, becomes equal to or smaller than 5 $cm^{-1}$. Therefore, as described above, when the same refractive index as that of the well layer 14 is obtained by adjusting the nitrogen crystal mixture ratio of the buried layer 18, it can be said enough to adjust the nitrogen crystal mixture ratio so that the refractive index coupling coefficient $\kappa_i$ becomes equal to or smaller than 5 $cm^{-1}$.

Figure 7:
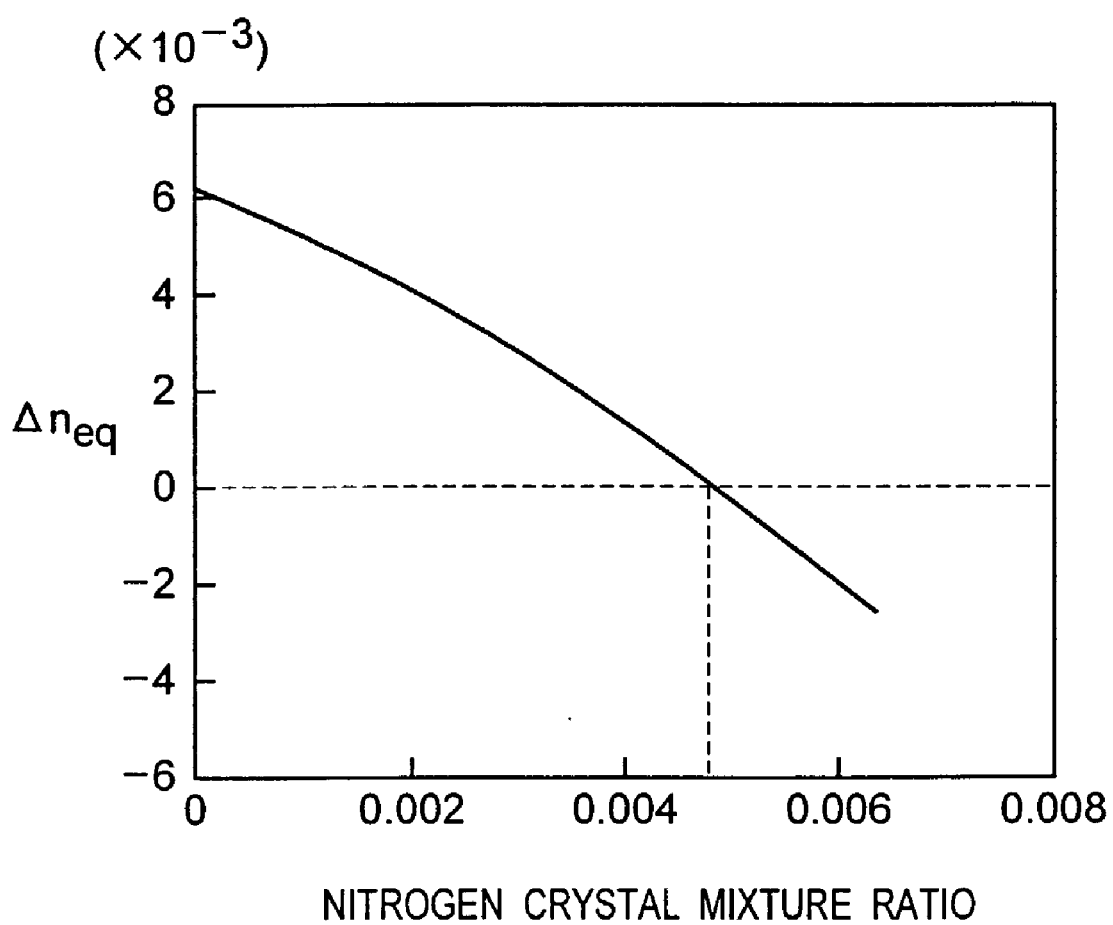
FIG. 7 is a graph showing a correlation between the nitrogen crystal mixture ratio and $\Delta n_{eq}$ in the resonator of the GC-DFB-LD shown in FIG. 1.

On the other hand, depending on the use of the GC-DFB-LD or the characteristics expected for the GC-DFB-LD, it is sometimes possible to require both of a specified quantity of refractive index coupling and gain coupling instead of the intrinsic GC-DEB-LD that has no refractive index distribution. The first embodiment can also satisfy the above-mentioned requirement. FIG. 7 shows a correlation between the nitrogen crystal mixture ratio (horizontal axis of FIG. 7) in the portions that employ the GaAsN mixed crystal (lower barrier layer 13, intermediate barrier layer 15, upper barrier layer 16, and buried layer 18) and $\Delta n_{eq}$ (vertical axis of FIG. 7) that represents the intensity of the periodic change of the equivalent refractive index $n_{eq}$ inside the resonator in the structure of the gain diffraction grating type GC-DFB-LD 10 shown in FIG. 1. In this case, $\Delta n_{eq}$ was defined as a difference ($\Delta n_{eq} = n_{eq}(Y) - n_{eq}(Z)$) between the equivalent refractive index $n_{eq}(Y)$ in the cross section of the protruding portion indicated by Y–Y' of the diffraction grating 17 and the equivalent refractive index $n_{eq}(Z)$ in the cross section of the recess portion indicated by Z–Z' of the diffraction grating 17 in FIG. 1.

Then, the magnitude of the refractive index coupling coefficient $\kappa_i$ has a strong correlation to the absolute value of this $\Delta n_{eq}$. When the nitrogen crystal mixture ratio is "0.0048", corresponding to the first embodiment, the periodic change $\Delta n_{eq}$ of the equivalent refractive index $n_{eq}$ inside the resonator is "0" and is not accompanied by the refractive index coupling, as is apparent from FIG. 7. In contrast to this, when the nitrogen crystal mixture ratio is "0", corresponding to the first comparative example, the periodic change $\Delta n_{eq}$ of the equivalent refractive index $n_{eq}$ inside the resonator exists while being accompanied by the refractive index coupling.

If the nitrogen crystal mixture ratio of the GaAsN mixed crystals is herein set at an arbitrary value between "0" to "0.0048", then a GC-DFB-LD, the degree of refractive index coupling of which is set at an arbitrary value, can be obtained. In this case, there can be obtained an in-phase type gain diffraction grating, in which the portion of a high equivalent refractive index $n_{eq}$ coincides with the portion of a high gain. Moreover, if the nitrogen crystal mixture ratio is set at a value greater than "0.0048", then there can be obtained an anti-phase type gain diffraction grating, in which the portion of a high equivalent refractive index $n_{eq}$ coincides with the portion of a low gain.

As described above, by providing the layer that emits the induced emission light or the layer that absorbs the induced emission light with the periodic structure, providing the layer crystallinically mixed with nitrogen adjacently to the layer and variously setting the nitrogen crystal mixture ratio, a variety of characteristic gain diffraction gratings can be obtained. That is, the characteristics of the GC-DFB-LD can easily be controlled.

In the first embodiment, there has been described the structure in which the InGaAs well layer 14 is periodically divided into parts and thereafter peripherally enclosed by GaAsN as one example of the structure of the gain diffraction grating type GC-DFB-LD in which the barrier layers 13, 15 and 16 and the buried layer 18 are formed of GaAsN and the well layer 14 is formed of InGaAs. However, as the structure of the gain diffraction grating of this invention, the structures described in connection with the following first through fourth modification examples can be provided.

FIRST MODIFICATION EXAMPLE

Figure 8A:
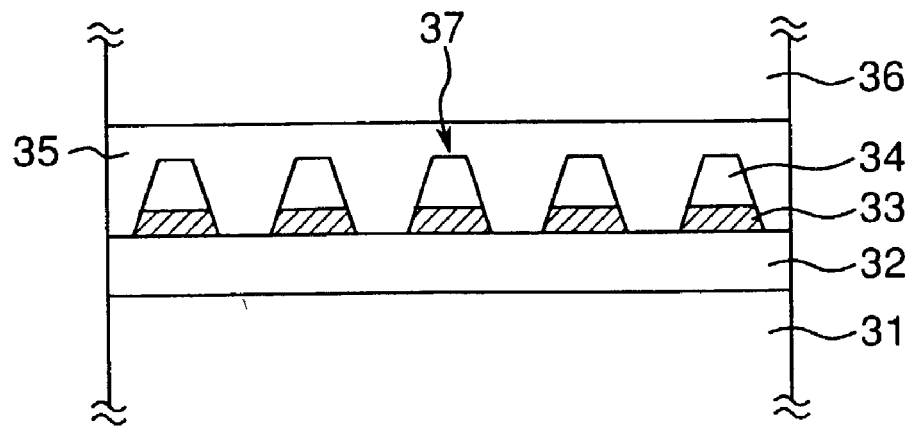
FIGS. 8A, 8B and 8C are longitudinal sectional views of an essential part located in the vicinity of the active layers of the GC-DFB-LD's of the first through third modification examples.

FIG. 8A shows a longitudinal cross-section of an essential part located in the vicinity of the active layer placed between the upper and lower clad layers in the gain diffraction grating type GC-DFB-LD of the first modification example. In this case, the construction, the material and the film thickness of each portion are as follows.

Lower clad layer 31:
  n-type $Al_{0.3}Ga_{0.7}As$; 1.0 μm
Lower barrier layer 32:
  i-GaAs; 70 nm (thickest portion)
Well layer 33:
  i-$In_{0.2}Ga_{0.8}As$; 9 nm
Upper barrier layer 34:
  i-$GaAs_{0.9952}N_{0.0048}$; 20 nm
Buried layer 35:
  i-$GaAs_{0.9952}N_{0.0048}$; 50 nm (thinnest portion)
Upper clad layer 36:
  p-type $Al_{0.3}Ga_{0.7}As$; 1.0 μm In the first embodiment, the top, bottom, right and left portions of the InGaAs well layer 14 are entirely adjacent to the GaAsN material. In contrast to this, in the first modification example, the lower barrier layer 32 located adjacently under the InGaAs well layer 33 is constructed of a GaAs material instead of the GaAsN material. Moreover, etching in forming the diffraction grating 37 does not etch the upper surface of the lower barrier layer 32.

Even in the case of the gain diffraction grating type GC-DFB-LD of the above-mentioned structure, no refractive index perturbation occurs. Further, at least the lower end surface of the InGaAs well layer 33 is to be adjacent to a material of a larger bandgap (GaAs in the first modification example) than that of GaAsN, and this allows the efficiency of confining carriers in the InGaAs well layer 33 to be improved.

SECOND MODIFICATION EXAMPLE

Figure 8B:
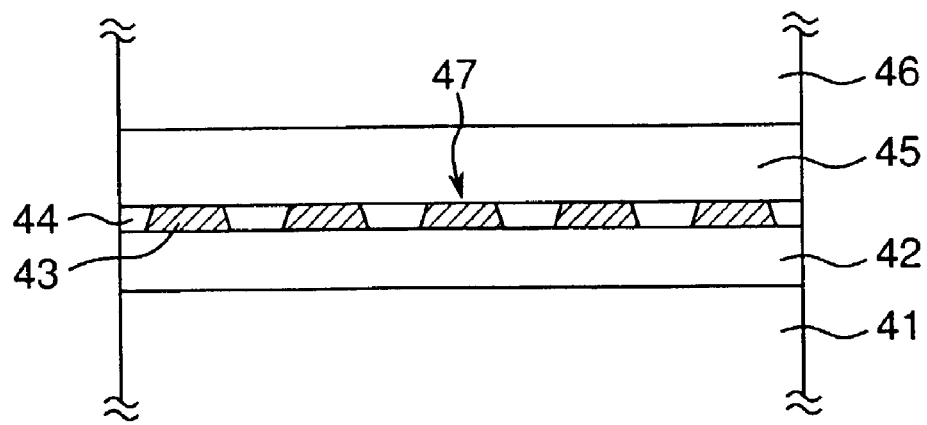

FIG. 8B shows a longitudinal cross-section of an essential part located in the vicinity of the active layer placed between the upper and lower clad layers in the gain diffraction grating type GC-DFB-LD of the second modification example. In this case, the construction, the material and the film thickness of each portion are as follows.

Lower clad layer 41:
  n-type $Al_{0.3}Ga_{0.7}As$; 1.0 μm
Lower barrier layer 42:
  i-GaAs; 70 nm
Well layer 43:
  i-$In_{0.2}Ga_{0.8}As$; 12 nm
Side buried layer 44:
  i-$GaAs_{0.9952}N_{0.0048}$; 12 nm
Buried layer 45:
  i-GaAs; 50 nm (thinnest portion)
Upper clad layer 46:
  p-type $Al_{0.3}Ga_{0.7}As$; 1.0 μm In the first embodiment, the top, bottom, right and left portions of the InGaAs well layer 14 are entirely adjacent to the GaAsN material. In contrast to this, in the second modification example, only the side buried layer 44, which is located adjacent to the InGaAs well layer 43, is constructed of the GaAsN material.

Even in the case of the gain diffraction grating type GC-DFB-LD of the above-mentioned structure, no refractive index perturbation occurs. Further, the upper and lower end surfaces of the InGaAs well layer 43 are to be adjacent to a material of a larger bandgap (GaAs in the second modification example) than that of GaAsN, and this allows the efficiency of confining carriers in the InGaAs well layer 43 to be improved.

The GaAsN side buried layer 44 located on the side surfaces of the InGaAs well layer 43 is formed by preliminarily forming a silicon nitride mask (not shown) on top of the diffraction grating 47 and growing the layer again so that the layer is brought in contact with the side surfaces of the InGaAs well layer 43 by selective growth.

THIRD MODIFICATION EXAMPLE

Figure 8C:
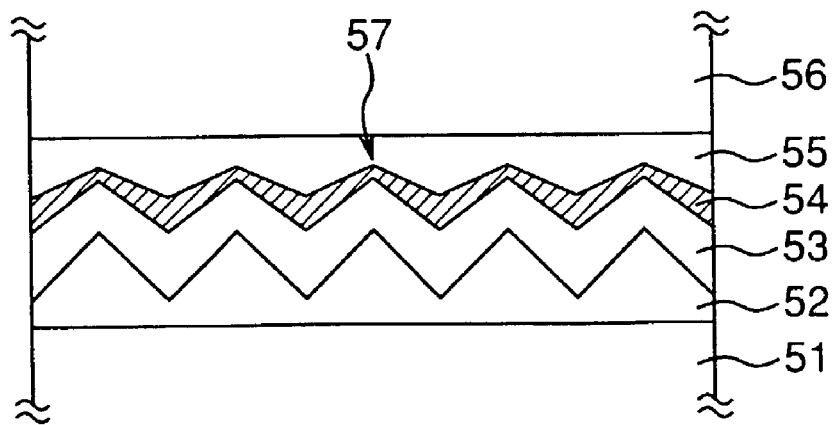

FIG. 8C shows a longitudinal cross-section of an essential part located in the vicinity of the active layer placed between the upper and lower clad layers in the gain diffraction grating type GC-DFB-LD of the third modification example. In this case, the construction, the material and the film thickness of each portion are as follows.

Lower clad layer 51:
   n-type $Al_{0.3}Ga_{0.7}As$; 1.0 μm
Guide layer 52:
   i-$GaAs_{0.9952}N_{0.0048}$; 20 nm (thinnest portion)
Barrier layer 53:
   i-$GaAs_{0.9952}N_{0.0048}$; 50 nm (thickest portion)
Well layer 54:
   i-$In_{0.2}Ga_{0.8}As$; 13 nm (thickest portion)
Buried layer 55:
   i-$GaAs_{0.9952}N_{0.0048}$; 50 nm (thinnest portion)
Upper clad layer 56:
   p-type $Al_{0.3}Ga_{0.7}As$; 1.0 μm In the first embodiment, the multi-layer including the InGaAs well layer 14 are laminated on the flat substrate 11, the InGaAs well layer 14 is etched in a diffraction grating shape so as to be divided into parts and thereafter buried in GaAsN. In contrast to this, in the third modification example, the GaAsN guide layer 52, or the groundwork, is provided with a corrugated configuration, and the GaAsN barrier layer 53, the InGaAs well layer 54 and the GaAsN buried layer 55 are grown again on it, forming the diffraction grating 57. Therefore, a distribution having a periodicity is generated in the film thickness of the InGaAs well layer 54 reflecting the corrugated configuration of the GaAsN guide layer 52 of the groundwork, and gain perturbation is obtained.

Even in the case of the gain diffraction grating type GC-DFB-LD of the above-mentioned structure, the upper and lower portions of the InGaAs well layer 54 are entirely enclosed by the GaAsN material. Therefore, no refractive index perturbation occurs, and an intrinsic GC-DFB-LD can be obtained.

FOURTH MODIFICATION EXAMPLE

Figure 9A:
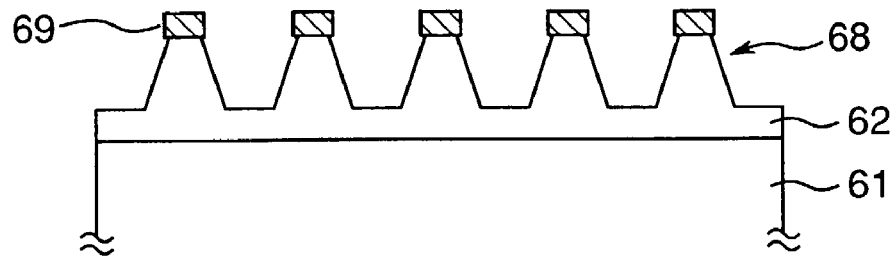
FIGS. 9A, 9B and 9C are longitudinal sectional views of an essential part located in the vicinity of the active layer of the GC-DFB-LD of a fourth modification example.
Figure 9B:
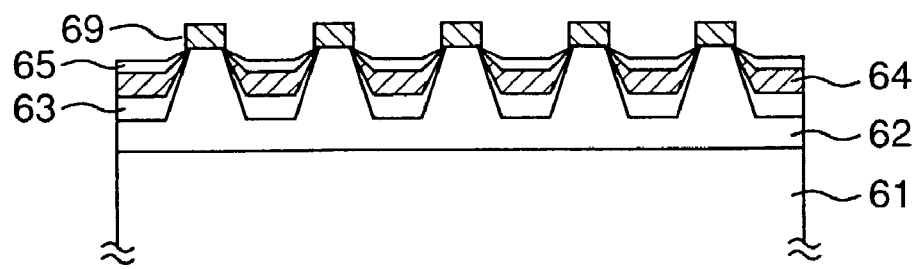
Figure 9C:
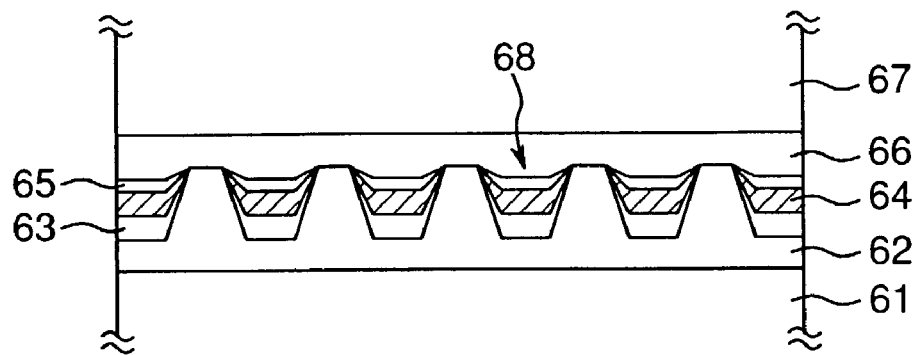

FIGS. 9A–9C show a longitudinal cross-sections of an essential part located in the vicinity of the active layer placed between the upper and lower clad layers, showing processes for forming the gain diffraction grating type GC-DFB-LD of the fourth modification example. In this case, the construction, the material and the film thickness of each portion are as follows.

Lower clad layer 61:
   n-type $Al_{0.3}Ga_{0.7}As$; 1.0 μm
Guide layer 62:
   i-$GaAs_{0.9952}N_{0.0048}$; 50 nm (thinnest portion)
Lower barrier layer 63:
   i-$GaAs_{0.9952}N_{0.0048}$; 20 nm (thickest portion)
Well layer 64:
   i-$In_{0.2}Ga_{0.8}As$; 10 nm (thickest portion)
Upper barrier layer 65:
   i-$GaAs_{0.9952}N_{0.0048}$; 20 nm (thickest portion)
Buried layer 66:
   i-$GaAs_{0.9952}N_{0.0048}$; 50 nm (thinnest portion)
Upper clad layer 67:
   p-type $Al_{0.3}Ga_{0.7}As$; 1.0 μm The structure shown in FIG. 9C is fabricated through the processes of FIG. 9A to FIG. 9C. That is, first of all, as shown in FIG. 9A, the layers up to the guide layer 62 are laminated on a substrate through first-time crystal growth, and thereafter, a periodic diffraction grating-shaped dielectric mask 69 is formed on its surface. Then, a periodic structure 68 is engraved in the guide layer 62 by wet etching. Next, as shown in FIG. 9B, the lower barrier layer 63, the well layer 64 and the upper barrier layer 65 are selectively grown in the recess portion of the periodic structure 68 with the dielectric mask 69 left through second-time crystal growth. Finally, the dielectric mask 69 is removed, and the layers above the buried layer 66 inclusive are grown again through third-time crystal growth, completing a gain diffraction grating type GC-DFB-LD of the structure shown in FIG. 9C.

In this modification example, the GaAsN guide layer 62 is provided with a corrugated configuration similarly to the case of the aforementioned third modification example, and a quantum well structure constructed of the InGaAs well layer 64 and the GaAsN barrier layers 63 and 65 are grown again on it. However, since the active layer 64 is divided into parts, a gain perturbation more intense than that of the third modification example is obtained.

Even in the case of the gain diffraction grating type GC-DFB-LD of the above-mentioned structure, the upper, lower, right and left portions of the InGaAs well layer 64 are entirely enclosed by the GaAsN material. Therefore, no refractive index perturbation occurs, and an intrinsic GC-DFB-LD can be obtained. Moreover, if the width of the recess portion of the periodic structure 68 is sufficiently reduced and the width of the well layer 64 is narrowed to a width of not greater than about 10 nm, then the active layer (well layer) 64 can also be made to function as a quantum wire.

It is a matter of course that the present invention can also be applied to diffraction grating structures other than those described concretely in connection with the first embodiment and the first through fourth modification examples.

Second Embodiment

The present embodiment is related to an absorptive diffraction grating type GC-DFB-LD and is characterized in that an intrinsic GC-DFB-LD is obtained by periodically forming an absorptive layer in a guide layer located adjacent to the active layer and making the absorptive layer adjoin a transparent layer mixed crystallinically with a small amount of nitrogen.

Figure 10:
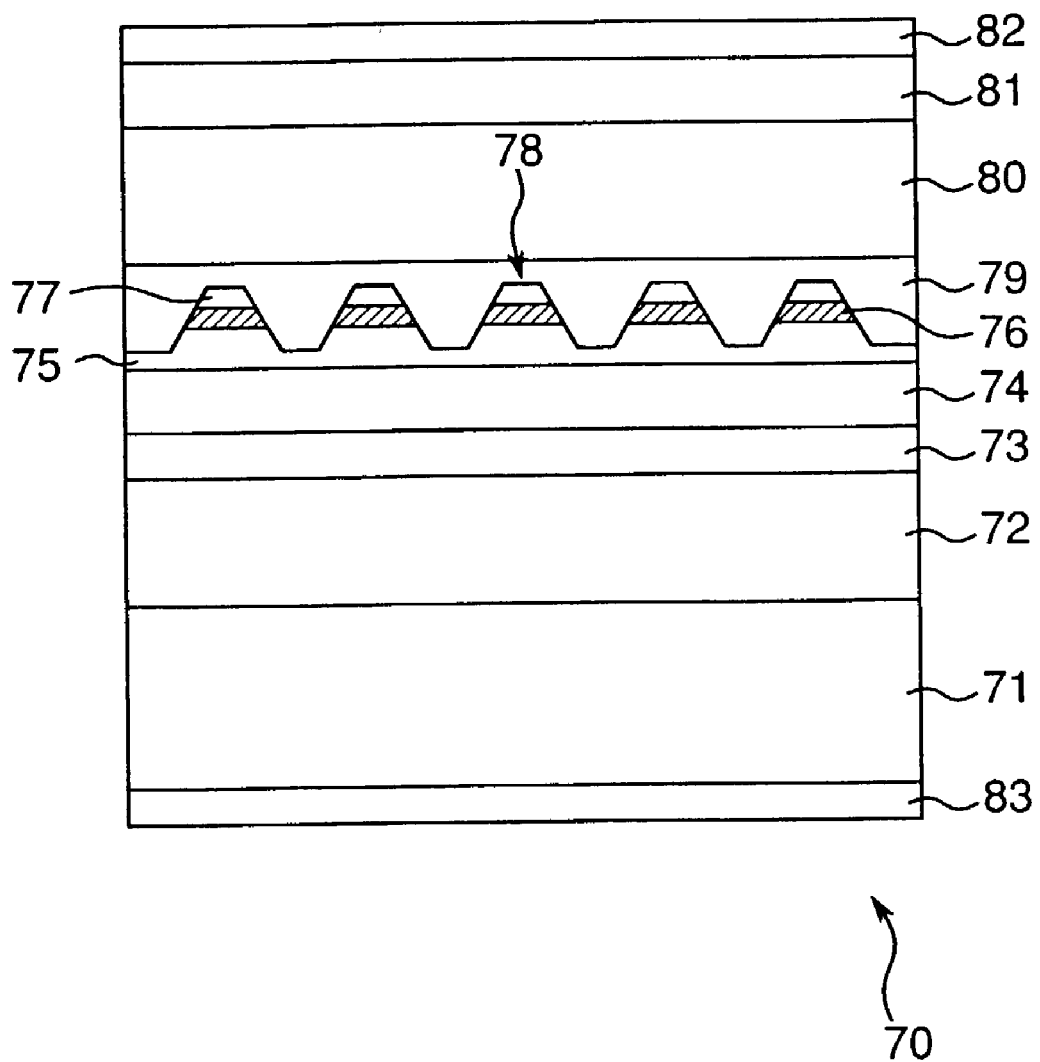
FIG. 10 is a longitudinal sectional view of a GC-DFB-LD different from that of FIG. 1.

FIG. 10 schematically shows the cross-sectional structure of the absorptive diffraction grating type GC-DFB-LD 70 of the present embodiment. The construction, the material and the layer thickness of each portion are as follows.

Figure 11A:
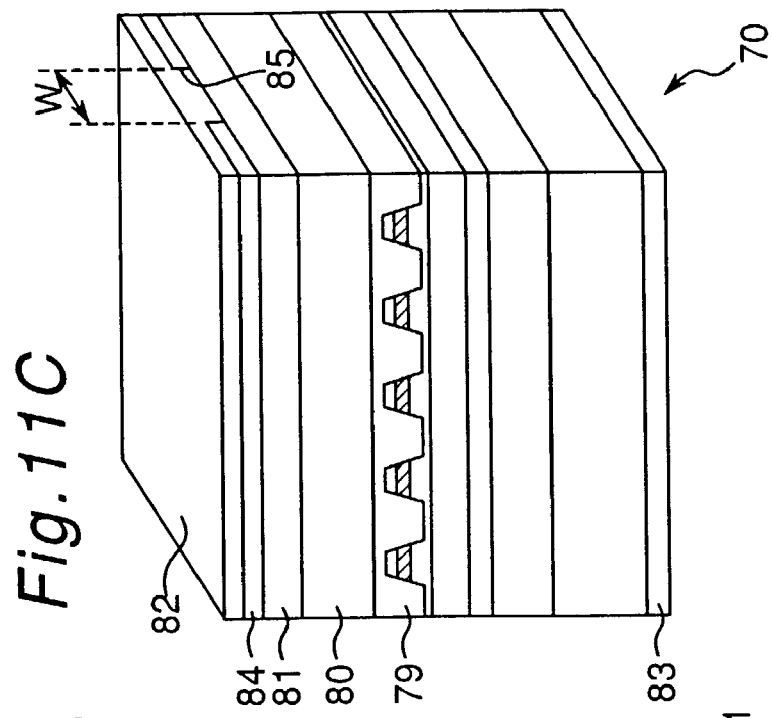
FIGS. 11A, 11B and 11C are perspective views of a laminate structure during the forming processes of the GC-DFB-LD shown in FIG. 10.
Figure 11B:
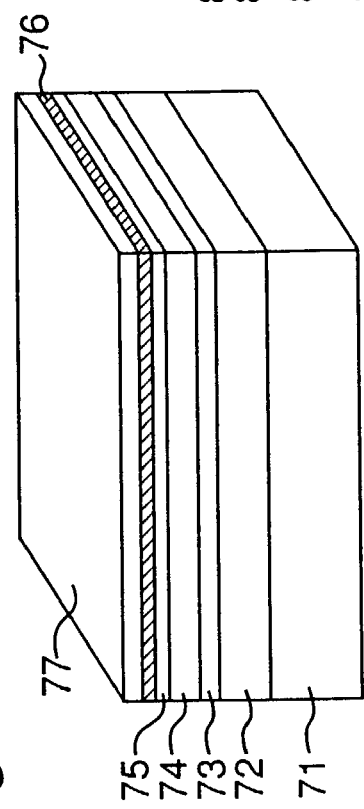
Figure 11C:
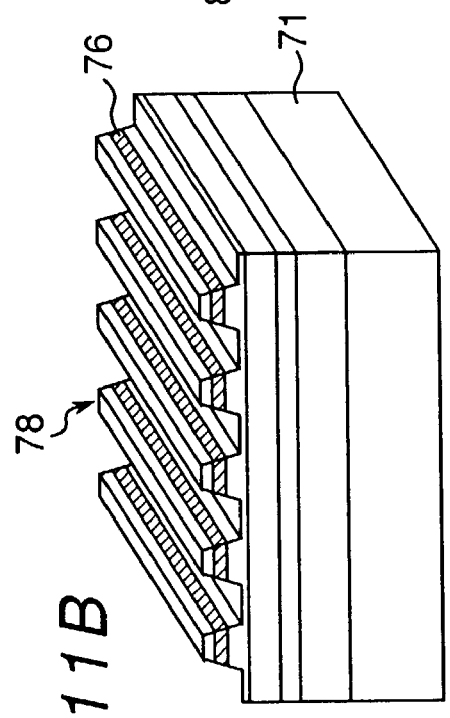

Substrate 71:
   n-type GaAs; 100 μm
Lower clad layer 72:
   n-type $Al_{0.3}Ga_{0.7}As$; 1.0 μm
Active layer 73:
   i-$Ga_{0.98}In_{0.02}N_{0.007}As_{0.993}$; 0.15 μm
Career barrier layer 74:
   p-type $Al_{0.3}Ga_{0.7}As$; 0.1 μm
Lower barrier layer 75:
   p-type $GaAs_{0.9952}N_{0.0048}$; 50 nm
Absorptive layer 76:
   n-type $In_{0.2}Ga_{0.8}As$; 10 nm (thickest portion)
Upper barrier layer 77:
   p-type $GaAs_{0.9952}N_{0.0048}$; 20 nm Buried layer 79:
　　p-type $GaAs_{0.9952}N_{0.0048}$; 20 nm (thinnest portion)
Upper clad layer 80:
　　p-type $Al_{0.3}Ga_{0.7}As$; 1.0 μm
Contact layer 81:
　　$p^+$-type GaAs; 0.5 μm
P-electrode metal 82:
　　AuZn
N-electrode metal 83:
　　AuGe/Ni The GC-DFB-LD 70, which has the above-mentioned structure, is formed as follows. FIGS. 11A–11C show perspective views of the laminate structure during the forming processes of the GC-DFB-LD 70 shown in FIG. 10. The fabricating method of the GC-DFB-LD 70 shown in FIG. 10 will be described below with reference to FIGS. 11A–11C.

First of all, as shown in FIG. 11A, the layers of the lower clad layer 72 to the upper barrier layer 77 are successively laminated on the n-type GaAs substrate 71 through first-time crystal growth using the metal-organic vapor deposition method. In the above case, the n-type GaAs substrate 71 uses the (100) plane. Moreover, according to the metal-organic vapor deposition method, there were employed trimethylaluminum, trimethylgallium, trimethylindium, arsine and dimethylhydrazine as the raw materials of Al, Ga, In, As and N. Thus, the laminate structure, which has undergone the first-time crystal growth, is taken out of the crystal growth chamber, and a grating-shaped photoresist mask (not shown) having a cycle of 0.28 μm and a duty ratio of 0.5 is formed on its surface by the two-beam interference exposure method.

Next, by an etchant obtained by mixing hydrochloric acid with a hydrogen peroxide aqueous solution at a ratio of 1:50 and diluting the mixture with five parts of pure water, regions where the photoresist mask is not formed are etched by a thickness of 50 nm from the surface. In the above case, the upper barrier layer 77 has a film thickness of 20 nm and the absorptive layer 76 has a film thickness of 10 nm. Therefore, a total film thickness of the upper barrier layer 77 to the absorptive layer 76 is 30 nm. Therefore, when the photoresist mask is removed, as shown in FIG. 11B, a diffraction grating 78, in which the absorptive layer 76 is periodically divided in the direction in which the n-type GaAs substrate 71 extends, is obtained.

Next, the laminate structure shown in FIG. 11B is put again into the crystal growth chamber, and the layers of the buried layer 79 to the contact layer 81 are grown on the diffraction grating 78 through second-time crystal growth as shown in FIG. 11C. In the above case, the buried layer 79 is crystallinically grown by setting the growth rate during the crystal growth to 1 μm/hour or less so that the interface between the buried layer 79 and the upper clad layer 80 becomes flat. The laminate structure, which has undergone the second-time crystal growth, is taken out of the crystal growth chamber, and a current constriction layer 84 of silicon nitride is formed on its surface as shown in FIG. 11C. A stripe-shaped aperture 85 of a width W (=5 μm) is formed in a direction orthogonal to the direction in which the diffraction grating 78 extends by the normal photolithography and wet etching. Finally, as shown in FIG. 11C, the p-electrode 82 is formed on the upper surface of the laminate structure, and the n-type electrode 83 is formed on the lower surface. Then, by cleaving the laser light-emitting end surface, the absorptive diffraction grating type GC-DFB-LD 70 is obtained.

As the result of flowing a current through the p-electrode 82 and the n-electrode 83 of the absorptive diffraction grating type GC-DFB-LD 70 obtained as described above, oscillation occurred at a single wavelength of 950 nm at a threshold current density of 0.5 kA/cm². Furthermore, this GC-DFB-LD 70 oscillates at a complete single wavelength at a device temperature of −20° C. to +80° C. at a sub-mode suppression ratio of not lower than 20 dB. Moreover, it was discovered that no stop band was observed in the oscillation spectrum and the refractive index coupling component was zero.

Moreover, as the result of examining the oscillation spectrum of a plurality of absorptive diffraction grating type GC-DFB-LD's 70 obtained from one wafer, it was discovered that the single wavelength oscillation occurred with a probability of 97% despite the fact that no antireflection coating was provided on the laser light-emitting end surface, and this showed that the single wavelength laser fabrication yield was very high. These features are the characteristics peculiar to the intrinsic GC-DFB-LD that includes no refractive index coupling component.

The present second embodiment is characterized in that the layer located adjacent to the n-type $In_{0.2}Ga_{0.8}As$ absorptive layer 76 divided periodically by the diffraction grating 78 is slightly crystallinically mixed with nitrogen. That is, the intrinsic GC-DFB-LD is materialized with the refractive index set to a prescribed value without largely changing the bandgap by mixing the barrier layer and the buried layer crystallinically with nitrogen and properly adjusting the nitrogen crystal mixture ratio.

In detail, similarly to the detailed description in connection with the first embodiment, the nitrogen crystal mixture ratios of the barrier layers 75 and 77 and the buried layer 79 are adjusted so that InGaAs employed for the absorptive layer 76 and GaAsN employed for the barrier layers 75 and 77 and the buried layer 79 come to have same refractive index. In contrast to this, $GaAs_{0.9952}N_{0.00048}$ employed for the barrier layers 75 and 77 and the buried layer 79 has a bandgap of about 1.35 eV and is transparent with respect to the emission wavelength of 950 nm from the active layer 73. On the other hand, the n-type $In_{0.2}Ga_{0.8}As$ absorptive layer 76, which has an absorption edge of about 1.26 eV, is opaque with respect to the emission wavelength of 950 nm from the active layer 73. That is, the absorptive layer 76, the barrier layers 75 and 77 and the buried layer 79 all have same refractive index despite the fact that the diffraction grating 78 of the second embodiment is the absorptive diffraction grating formed by burying the opaque absorptive layer 76 in the transparent barrier layers 75 and 77 and buried layer 79, and no refractive index perturbation occurs.

Therefore, in the second embodiment, there is no need for considering the configuration of the diffraction grating 78, the balance of refractive index with respect to the buried layer 79 and so on, dissimilarly to the prior art structure in which the refractive index perturbation of the absorptive layer is canceled by the anti-phase refractive index perturbation provided in the neighborhood. No refractive index coupling substantially occurs so long as the diffraction grating 78 is buried flat, and the intrinsic GC-DEB-LD can easily be obtained.

It is a matter of course that the modifications corresponding to the first through fourth modification examples of the gain diffraction grating of the first embodiment can be achieved also in the absorptive diffraction grating of the second embodiment. In the above case, the well layers 33, 43, 54 and 64 of the first through fourth modification examples correspond to the absorptive layer in the absorptive diffraction grating of the second embodiment.

Third Embodiment

In connection with the first and second embodiments, there has been described the GC-DFB-LD having the structure in which GaInAs that is not crystallinically mixed with nitrogen is served as a light-emitting layer or an absorptive layer, and this light-emitting layer or the absorptive layer is buried in GaAsN that is mixed crystallinically with nitrogen. In connection with the third embodiment, there will be described a GC-DFB-LD having a structure in which either one of the light-emitting layer or the absorptive layer and the buried layer located adjacent to the layer is constructed of a material mixed crystallinically with nitrogen.

Figure 12:
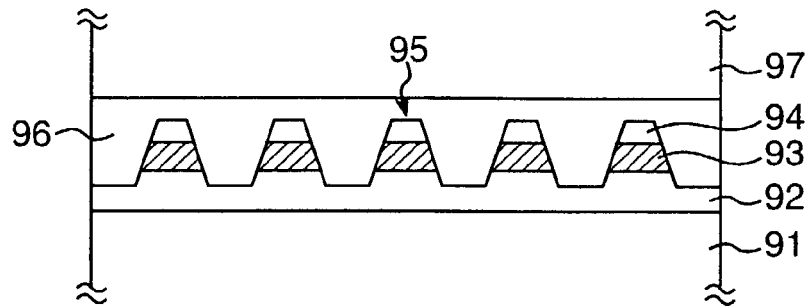
FIG. 12 is a longitudinal sectional view of an essential part located in the vicinity of the diffraction grating of a GC-DFB-LD different from those of FIG. 1 and FIG. 10.

FIG. 12 shows a longitudinal cross-section of an essential part located in the vicinity of the diffraction grating of the GC-DFB-LD of the present embodiment. In this case, the construction, the material and the layer thickness of each portion are as follows.

Lower wide bandgap layer 91:
$Al_{0.3}Ga_{0.7}As$
Lower barrier layer 92:
$In_{0.03}Ga_{0.97}As_{0.99}N_{0.01}$; 30 nm (thickest portion)
Narrow bandgap layer 93:
$In_{0.23}Ga_{0.77}As_{0.9948}N_{0.0052}$; 15 nm
Upper barrier layer 94:
$In_{0.03}Ga_{0.97}As_{0.99}N_{0.01}$; 20 nm
Buried layer 96:
$In_{0.03}Ga_{0.97}As_{0.99}N_{0.01}$; 30 nm (thinnest portion)
Upper wide bandgap layer 97:
$Al_{0.3}Ga_{0.7}As$ The diffraction grating 95 of the present embodiment functions as a gain diffraction grating if the narrow bandgap layer 93 is placed as a light-emitting layer between p/n reverse conducting type clad layers as in the case of the first embodiment. The grating functions as an absorptive diffraction grating if the narrow bandgap layer 93 is buried as an absorptive layer in a p-type or n-type clad layer as in the case of the second embodiment.

In the diffraction grating 95, each one of the narrow bandgap layer 93 that functions as the light-emitting layer or the absorptive layer and the barrier layers 92 and 94 and the buried layer 96 located adjacent to it is mixed crystallinically with nitrogen. Then, the narrow bandgap layer 93 that functions as the light-emitting layer or the absorptive layer has its nitrogen crystal mixture ratio set smaller than that of the layers adjacent to it. As a result, the layers, which have a high nitrogen crystal mixture ratio and enclose the periphery of the narrow bandgap layer 93, are each constructed of a material of a large increase in refractive index in accordance with a reduction in bandgap. In the above case, an intrinsic GC-DFB-LD is obtained by selecting the nitrogen crystal mixture ratio of each layer so that no refractive index distribution is caused while enclosing the periphery of the narrow bandgap layer 93 that has a narrow bandgap and a high refractive index with the material of a wide bandgap.

In the present embodiment, the narrow bandgap layer 93 and the barrier layers 92 and 94 and the buried layer 96 located adjacent to the narrow bandgap layer 93 are concurrently mixed crystallinically with a small amount of In. By so doing, a change in the lattice constant occurring in adjusting the refractive index by mixing the layers 92, 93, 94 and 96 crystallinically with an appropriate amount of nitrogen can be canceled by the crystallinic mixture of a small amount of In. Therefore, a more excellent GC-DFB-LD can be obtained.

No matter whether the diffraction grating 95 is the gain diffraction grating or the absorptive diffraction grating, the GC-DFB-LD provided with the built-in diffraction grating 95 of the aforementioned structure oscillates at a complete single wavelength at a sub-mode suppression ratio of not lower than 20 dB. Moreover, it was discovered that no stop band was observed in the oscillation spectrum and the refractive index coupling component was zero. Moreover, it was discovered that the single wavelength oscillation occurred with a probability of 97% despite the fact that no antireflection coating was provided on the laser light-emitting end surface, and this showed that the single wavelength laser fabrication yield was very high. These features are the characteristics peculiar to the intrinsic GC-DFB-LD that includes no refractive index coupling component.

It is a matter of course that the modifications of the diffraction grating corresponding to the first through fourth modification examples of the first embodiment can be achieved also in the third embodiment.

Fourth Embodiment

In connection with the first through third embodiments, the GC-DFB-LD's in which the diffraction gratings 17, 37, 47, 57, 68, 78 and 95 are constructed of the layer where GaAs is mixed crystallinically with In or N have been described. In connection with the fourth embodiment, there will be described a GC-DFB-LD constructed of a combination of materials obtained by mixing an AlGaAs material crystallinically with nitrogen.

Figure 13:
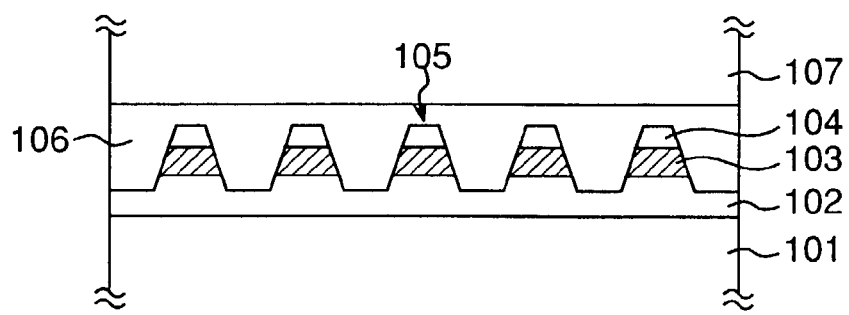
FIG. 13 is a longitudinal sectional view of an essential part located in the vicinity of the diffraction grating of a GC-DFB-LD different from those of FIG. 1, FIG. 10 and FIG. 12.

FIG. 13 shows the longitudinal cross-section of an essential part located in the vicinity of the diffraction grating of the GC-DFB-LD of the present embodiment. In this case, the construction, the material and the layer thickness of each portion are as follows.

Lower wide bandgap layer 101:
$Al_{0.5}Ga_{0.5}As$
Lower barrier layer 102:
$Al_{0.25}Ga_{0.75}As_{0.9965}N_{0.0035}$; 30 nm (thickest portion)
Narrow bandgap layer 103:
$Al_{0.1}Ga_{0.9}As$; 50 nm
Upper barrier layer 104:
$Al_{0.25}Ga_{0.75}As_{0.9965}N_{0.00035}$; 10 nm
Buried layer 106:
$Al_{0.25}Ga_{0.75}As_{0.9965}N_{0.0035}$; 30 nm (thinnest portion)
Upper wide bandgap layer 107:
$Al_{0.5}Ga_{0.5}As$ The diffraction grating 105 of the present embodiment functions as a gain diffraction grating if the narrow bandgap layer 103 is placed as a light-emitting layer between p/n reverse conducting type clad layers as in the first embodiment. The grating functions as an absorptive diffraction grating if the narrow bandgap layer 103 is buried as an absorptive layer in a p-type or n-type clad layer as in the second embodiment. For the clad layer, an arbitrary material, which has a low refractive index and a wide bandgap and is roughly lattice-matched with the substrate, can be selected.

In the diffraction grating 105, the barrier layers 102 and 104 and the buried layer 106, which are located adjacent to the narrow bandgap layer 103 that functions as the light-emitting layer or the absorptive layer, is mixed crystallinically with an appropriate amount of nitrogen. Therefore, similarly to the case described in connection with the first and second embodiments, an intrinsic GC-DFB-LD is obtained by selecting the nitrogen crystal mixture ratio of each layer so that no refractive index distribution is caused while enclosing the narrow bandgap layer 103, which has a narrow bandgap and a high refractive index, with a material of a wide bandgap.

No matter whether the diffraction grating 105 is the gain diffraction grating or the absorptive diffraction grating, the GC-DFB-LD provided with the built-in diffraction grating 105 of the aforementioned structure oscillates at a complete single wavelength at a sub-mode suppression ratio of not lower than 20 dB. Moreover, it was discovered that no stop band was observed in the oscillation spectrum and the refractive index coupling component was zero. Moreover, it was discovered that the single wavelength oscillation occurred with a probability of 97% despite the fact that no antireflection coating was provided on the laser light-emitting end surface, and this showed that the single wavelength laser fabrication yield was very high. These features are the characteristics peculiar to the intrinsic GC-DFB-LD that includes no refractive index coupling component.

As described above, the intrinsic GC-DFB-LD can easily be materialized with the AlGaAs material by mixing the layer located adjacent to the light-emitting layer or the absorptive layer crystallinically with nitrogen. It is a matter of course that the modifications of the diffraction grating corresponding to the first through fourth modification examples of the first embodiment can be achieved also in the present embodiment. Moreover, similarly to the third embodiment, the narrow bandgap layer 103, which functions as the light-emitting layer or the absorptive layer, can be mixed crystallinically with a smaller amount of nitrogen than those of the adjacent layers.

Fifth Embodiment

In connection with the fifth embodiment, there will be described a GC-DFB-LD constructed of a combination of materials obtained by mixing an AlInGaP-based material crystallinically with nitrogen.

Figure 14:
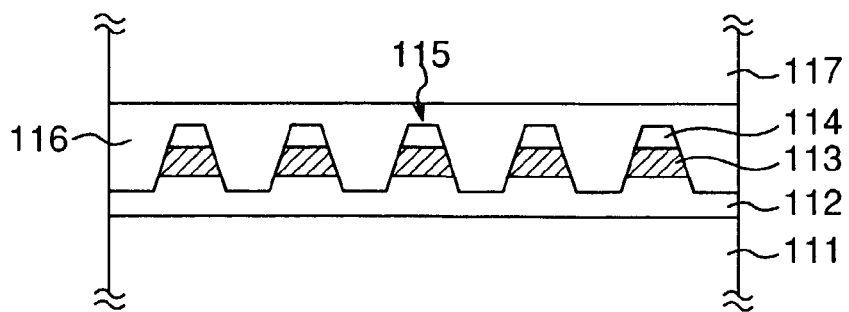
FIG. 14 is a longitudinal sectional view of an essential part located in the vicinity of the diffraction grating of a GC-DFB-LD different from those of FIG. 1, FIG. 10, FIG. 12 and FIG. 13.

FIG. 14 shows the longitudinal cross-section of an essential part located in the vicinity of the diffraction grating of the GC-DFB-LD of the present embodiment. In this case, the construction, the material and the layer thickness of each portion are as follows.

Lower wide bandgap layer 111:
  $(Al_{0.7}Ga_{0.3})_{0.5}In_{0.5}P$
Lower barrier layer 112:
  $(Al_{0.4}Ga_{0.6})_{0.5}In_{0.5}P_{0.9962}N_{0.0038}$; 100 nm (thickest portion)
Narrow bandgap layer 113:
  $(Al_{0.05}Ga_{0.095})_{0.5}In_{0.5}P$; 100 nm
Upper barrier layer 114:
  $(Al_{0.4}Ga_{0.6})_{0.5}In_{0.5}P_{0.9962}N_{0.0038}$; 20 nm
Buried layer 116:
  $(Al_{0.4}Ga_{0.6})_{0.5}In_{0.5}P_{0.9962}N_{0.0038}$; 50 nm (thinnest portion)
Upper wide bandgap layer 117:
  $(Al_{0.7}Ga_{0.3})_{0.5}In_{0.5}P$ Also, in the present embodiment, similarly to the fourth embodiment, the barrier layers 112 and 114 and the buried layer 116 located adjacent to the narrow bandgap layer 113, which functions as the light-emitting layer or the absorptive layer, are mixed crystallinically with an appropriate amount of nitrogen. Therefore, an intrinsic GC-DFB-LD is obtained by selecting the nitrogen crystal mixture ratio of each layer so that no refractive index distribution is caused while enclosing the narrow bandgap layer 113, which has a narrow bandgap and a high refractive index, with a material of a wide bandgap. The GC-DFB-LD in the above case oscillates at a complete single wavelength at a sub-mode suppression ratio of not lower than 20 dB. Moreover, it was discovered that the refractive index coupling component was zero and the single wavelength oscillation occurred with a probability of 97% despite the fact that no antireflection coating is provided on the laser light-emitting end surface.

As described above, the intrinsic GC-DFB-LD can easily be materialized with the AlGaAs material by mixing the light-emitting layer or the absorptive layer crystallinically with nitrogen. It is a matter of course that the modifications of the diffraction grating corresponding to the first through fourth modification examples of the first embodiment can be achieved also in the present embodiment. Moreover, similarly to the third embodiment, the narrow bandgap layer 113, which functions as the light-emitting layer or the absorptive layer, can be mixed crystallinically with a smaller amount of nitrogen than those of the adjacent layers.

Sixth Embodiment

In connection with the sixth embodiment, there will be described a GC-DFB-LD constructed of a combination of materials obtained by mixing a GaAsSb-based material crystallinically with nitrogen.

Figure 15:
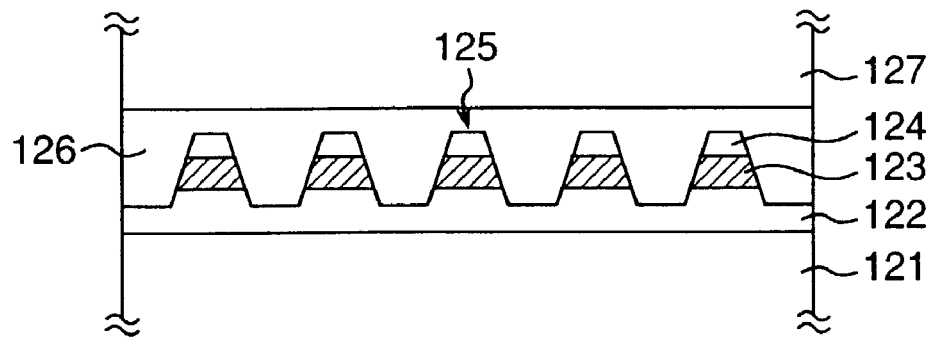
FIG. 15 is a longitudinal sectional view of an essential part located in the vicinity of the diffraction grating of a GC-DFB-LD different from those of FIG. 1, FIG. 10, and FIG. 12 through FIG. 14.

FIG. 15 shows a longitudinal cross-section of an essential part located in the vicinity of the diffraction grating of the GC-DFB-LD of the present embodiment. In this case, the construction, the material and the layer thickness of each portion are as follows.

Lower wide bandgap layer 121:
  $Al_{0.3}Ga_{0.7}As$
Lower barrier layer 122:
  $Ga(As_{0.98}Sb_{0.02})_{0.9923}N_{0.0077}$; 20 nm (thickest portion)
Narrow bandgap layer 123:
  $GaAs_{0.7}Sb_{0.3}$; 6 nm
Upper barrier layer 124:
  $Ga(As_{0.98}Sb_{0.02})_{0.9923}N_{0.0077}$; 20 nm
Buried layer 126:
  $Ga(As_{0.98}Sb_{0.02})_{0.9923}N_{0.0077}$; 20 nm (thinnest portion)
Upper wide bandgap layer 127:
  $Al_{0.3}Ga_{0.7}As$ Also, in the present embodiment, similarly to the fourth embodiment, an intrinsic GC-DFB-LD is obtained by selecting the nitrogen crystal mixture ratio of each layer so that no refractive index distribution is caused while enclosing the narrow bandgap layer 123, which has a narrow bandgap and a high refractive index, with a material of a wide bandgap. The GC-DFB-LD in the above case oscillates at a complete single wavelength at a sub-mode suppression ratio of not lower than 20 dB. Moreover, the refractive index coupling component is zero, and the single wavelength oscillation occurs with a probability of 97%. It is to be noted that the modifications of the diffraction grating corresponding to the first through fourth modification examples can be achieved also in the present embodiment. Moreover, the narrow bandgap layer 123, which functions as the light-emitting layer or the absorptive layer, can be mixed crystallinically with a smaller amount of nitrogen than those of the adjacent layers.

Seventh Embodiment

In connection with the seventh embodiment, there will be described a GC-DFB-LD constructed of a combination of materials obtained by mixing an InGaAsP-based material to be roughly lattice-matched with the InP substrate crystallinically with nitrogen.

Figure 16:
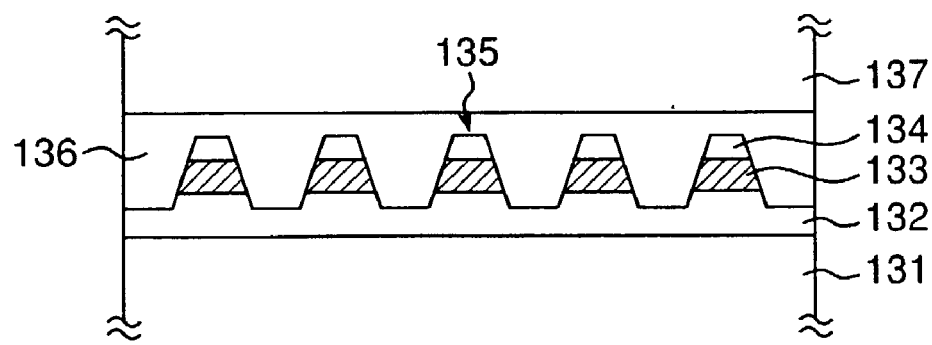
FIG. 16 is a longitudinal sectional view of an essential part located in the vicinity of the diffraction grating of a GC-DFB-LD different from those of FIG. 1, FIG. 10, and FIG. 12 through FIG. 15.

FIG. 16 shows a longitudinal cross-section of an essential part located in the vicinity of the diffraction grating of the GC-DFB-LD of the present embodiment. In this case, the construction, the material and the layer thickness of each portion are as follows.

Lower wide bandgap layer 131:
  InP
Lower barrier layer 132:
  $InP_{0.099}N_{0.01}$; 30 nm (thickest portion)
Narrow bandgap layer 133:
  $In(As_{0.3}P_{0.7})_{0.996}N_{0.004}$; 8 nm
Upper barrier layer 134:
  $InP_{0.99}N_{0.01}$; 20 nm
Buried layer 136:
  $InP_{0.99}N_{0.01}$; 30 nm (thinnest portion)
Upper wide bandgap layer 137:
  InP Also, in the present embodiment, similarly to the fourth embodiment, an intrinsic GC-DFB-LD is obtained by selecting the nitrogen crystal mixture ratio of each layer so that no refractive index distribution is caused while enclosing the narrow bandgap layer 133, which has a narrow bandgap and a high refractive index, with a material of a wide bandgap. The GC-DFB-LD in the above case oscillates at a complete single wavelength at a sub-mode suppression ratio of not lower than 20 dB. Moreover, the refractive index coupling component is zero, and the single wavelength oscillation occurs with a probability of 97%. It is to be noted that the modifications of the diffraction grating corresponding to the first through fourth modification examples can be achieved also in the present embodiment. Moreover, it is possible to mix the narrow bandgap layer 133, which functions as the light-emitting layer or the absorptive layer, crystallinically with no nitrogen and mix only the adjacent layers with an appropriate amount of nitrogen.

Eighth Embodiment

In connection with the eighth embodiment, there will be described the case where a substrate having a (100) plane is used and a diffraction grating is engraved in a [010] direction or a [00-1] direction or a direction crystallographically equivalent to the directions.

Figure 17:
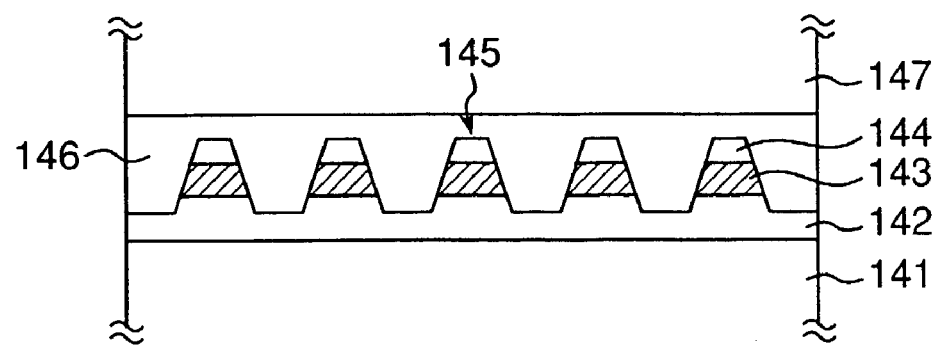
FIG. 17 is a longitudinal sectional view of an essential part located in the vicinity of the diffraction grating of a GC-DFB-LD different from those of FIG. 1, FIG. 10, and FIG. 12 through FIG. 16.

FIG. 17 shows a longitudinal cross-section of an essential part located in the vicinity of the diffraction grating of the GC-DFB-LD of the present embodiment. In this case, the construction, the material and the layer thickness of each portion are as follows.

Lower wide bandgap layer 141:
  $Al_{0.3}Ga_{0.7}As$
Lower barrier layer 142:
  $GaAs_{0.9952}N_{0.0048}$; 20 nm (thickest portion)
Narrow bandgap layer 143:
  $In_{0.2}Ga_{0.8}As$; 6 nm
Upper barrier layer 144:
  $GaAs_{0.9952}N_{0.0048}$; 20 nm
Buried layer 146:
  $GaAs_{0.9952}NO_{0.0048}$; 20 nm (thinnest portion)
Upper wide bandgap layer 147:
  $Al_{0.3}Ga_{0.7}As$ FIG. 18 shows a perspective view of a laminate structure 140 obtained immediately after fabricating at least the lower wide bandgap layer 141, the lower barrier layer 142, the narrow bandgap layer 143 and the upper barrier layer 144 on a GaAs substrate and engraving a diffraction grating 145 on its surface in the fabricating process of the GC-DFB-LD of the present embodiment. The present embodiment is characterized in that the (100) plane of the GaAs substrate is used and the diffraction grating 145 is engraved in the [010] direction (or in the [00-1] direction orthogonal to it, producing the same effect).

As described in connection with the first embodiment, if crystals mixed crystallinically with nitrogen are grown on a surface (referred to as an A surface) inclined in the [011] direction from the (100) plane, then nitrogen is more easily taken into the film than when crystals are grown on the (100) plane, and nitrogen is hardly taken into a surface (referred to as a B surface) inclined in the [00-1] direction, on the contrary. Therefore, when the diffraction grating 145 is engraved in the [011] direction or the [00-1] direction, the flat portions of the ridge and groove of the corrugated configuration of the diffraction grating 145 come to have a (100) plane. On the other hand, the inclined portions come to have the A surface or the B surface, and a periodic distribution reflecting the corrugated configuration of the diffraction grating 145 disadvantageously occurs in the nitrogen crystal mixture ratio in the film grown on the diffraction grating 145.

In this case, the present inventor discovered that the aforementioned problems did not occur when the crystals mixed crystallinically with nitrogen were grown on the surface inclined in the [010] direction or the [00-1] direction orthogonal to it. This is presumably ascribed to the fact that the surface inclined in the [010] direction has a property intermediate between those of the A surface and the B surface since the [010] direction or the [00-1] direction orthogonal to it is a direction that forms an angle of 45 degrees with the [011] direction and the [00-1] direction. Therefore, if the diffraction grating 145 is engraved in the [010] direction or the [00-1] direction orthogonal to it, then the surface, which is inclined in the [010] direction or the direction orthogonal to it is to be exposed as the inclined surface of the diffraction grating 145. With regard to the nitrogen crystal mixture ratio in the film grown on the diffraction grating 145, a uniform distribution is obtained without reflecting the corrugated configuration of the diffraction grating 145 regardless of the growth rate during the crystal growth.

It is to be noted that the plane index of the substrate is not necessarily required to be the (100) plane but only required to be a plane crystallography equivalent to the (100) plane. In the above case, it is a matter of course that the direction, in which the diffraction grating 145 is engraved, be the [010] direction or the [00-1] direction orthogonal to it or a direction crystallographically equivalent to them.

Also, in the present embodiment, similarly to the fourth embodiment, an intrinsic GC-DFB-LD is obtained by selecting the nitrogen crystal mixture ratio of each layer so that no refractive index distribution is caused while enclosing the narrow bandgap layer 143, which has a narrow bandgap and a high refractive index, with a material of a wide bandgap. The GC-DFB-LD in the above case oscillates at a complete single wavelength at a sub-mode suppression ratio of not lower than 20 dB. Moreover, the refractive index coupling component is zero, and the single wavelength oscillation occurs with a probability of 97%. It is to be noted that the modifications of the diffraction grating corresponding to the first through fourth modification examples can be achieved also in the present embodiment. Moreover, it is possible to mix the narrow bandgap layer 133, which functions as the light-emitting layer or the absorptive layer, crystallinically with a smaller amount of nitrogen than those of the adjacent layers.

It is to be noted that the diffraction gratings 125, 135 and 145 of the sixth, seventh and eighth embodiments function as a gain diffraction grating if the narrow bandgap layers 123, 133 and 143 are placed as a light-emitting layer between p/n reverse conducting type clad layers. Moreover, if the narrow bandgap layers 123, 133 and 143 are buried as an absorptive layer in a p-type or n-type clad layer, then the layers function as an absorptive diffraction grating. For the clad layer, there can be selected an arbitrary material, which has a low refractive index and a wide bandgap and is roughly lattice-matched with the substrate.

As described above, according to the fourth through eighth embodiments, an intrinsic GC-DFB-LD can easily be materialized with an arbitrary material system by mixing the layers adjacent to the light-emitting layer or the absorptive layer crystallinically with nitrogen.

In this case, in the sixth embodiment, the refractive index is adjusted by mixing the barrier layers 122 and 124 and the buried layer 126, which are located adjacent to the narrow bandgap layer 123, crystallinically with an appropriate amount of nitrogen and crystallinically with a small amount of Sb at the same time. With this arrangement, a change in the lattice constant caused by the crystallinic mixture of nitrogen can be canceled, and a more excellent GC-DFB-LD can be obtained. It is to be noted that the effect of crystallinically mixing Sb at the same time can be obtained similarly even by the crystallinic mixture of In as described in connection with the third embodiment. Moreover, it is a matter of course that both Sb and In can be crystallinically mixed.

Moreover, in connection with each of the first through fourth modification examples and the second through eighth embodiments, there has been described one example of the concrete structures and the crystal mixture ratio of each layer for obtaining the intrinsic GC-DFB-LD. However, even in the modification examples and the embodiments, a prescribed refractive index coupling can be introduced by setting the nitrogen crystal mixture ratio to an arbitrary value similarly to the case of the first embodiment. In the above case, by controlling the nitrogen crystal mixture ratio of the nitrogen mixed crystal layer, the degree of refractive index coupling, phases relative to the refractive index and the gain can be arbitrarily controlled without performing precise control of the configuration and so on of the diffraction grating. There can, of course, be obtained a structure in which the refractive index coupling is made to be zero.

The materials, which constitute a semiconductor laser, are not limited to the material systems and the crystal mixture ratios adopted by each of the aforementioned embodiments. For example, the present invention can be applied to an arbitrary group III–V semiconductor material system such as (Al,Ga,In,B,Tl)-(P,As,Sb,N,Bi). Moreover, various modifications are possible with regard to the combination of the material systems as exemplified by constituting only the diffraction grating portion of the group III–V semiconductor and constituting the clad layer, the current constriction layer or the like of the group II–VI semiconductor. Moreover, the crystal growth method and the raw materials to be employed are not limited by the ones concretely shown in connection with the aforementioned embodiments and modification examples, and a variety of methods can be adopted.

Further, the fabrication method, the structure and the position of the diffraction grating are not limited by the those of the aforementioned embodiments and modification examples. With regard to the structures of the gain diffraction grating and the absorptive diffraction grating, those shown in connection with the aforementioned embodiments and modification examples are mere examples, and a variety of modifications can be achieved. In particular, with regard to the shape of the diffraction grating, the trapezoidal shape has been described. However, the shape may be a rectangular shape, a triangular shape, a sawtooth wave shape, a sine wave shape, an inverted trapezoidal shape or the like.

Moreover, the exposure method of the diffraction grating should not be limited. When a DFB-LD is utilized as a monolithic light source of an optical integrated circuit, a technique for directly drawing a diffraction grating by the electron beam exposure method is effective. Moreover, the diffraction grating may have a phase shift. Although the phase of the diffraction grating becomes discontinuous in the device center portion, there can be adopted a variety of phase shift methods such as a multi-shift type such that a plurality of phase shifts are distributed in the resonator, a graded shift type such that the phase is gradually shifted and a stripe width shift type such that an effective phase shift is achieved by changing the width of a stripe-shaped refractive index waveguide. Moreover, the active layer that has a periodic structure in the gain diffraction grating and the absorptive layers that has a periodic structure in the absorptive diffraction grating may be either a quantum well of an arbitrary number of wells or a bulk crystal that has no quantum effect.

Moreover, the end surface reflectance of the laser element can be controlled by coating a thin film of a variety of materials. In detail, it is possible to achieve high power and high efficiency by providing an antireflection coating on one end surface and providing a reflection coating on the other end surface or provide a variety of structures by roughening or cutting aslant the end surface, forming a window structure and so on.

Moreover, no limitation is imposed on the shape and fabricating method of the stripe-shaped waveguide structure for performing the current constriction and electric field control in the transverse direction. Although the broad stripe type stripe structure is provided in each of the aforementioned embodiments and modification examples, there can be adopted a variety of modifications such as a ridge waveguide type and a buried hetero type (Buried Heterostructure BH).

Moreover, the gain diffraction grating and the absorptive diffraction grating handled in each of the aforementioned embodiments and modification examples exhibit excellent properties as not only the GC-DFB-LD but also a wavelength filter for selectively transmitting or amplifying a specified wavelength. The aforementioned structure of the diffraction grating portion can also be applied to an optical control device that utilizes the above-mentioned fact. Moreover, the diffraction grating portion of this invention may be incorporated as part of an optical integrated circuit in which a variety of optical devices are integrated.

The direction referred to as "upper" in each of the aforementioned embodiments and modification examples means the direction away from the substrate, and the direction referred to as "lower" means the direction closer to the substrate. The crystal growth progresses from "lower" to "upper". Furthermore, the conductive type of the structure and the conductive type of the upper clad layer and the lower clad layer can each be replaced by the type opposite to the type described in connection with each of the embodiments and modification examples.

The invention claimed is:

1. A gain-coupled distributed-feedback type semiconductor laser device having a laminate structure and comprising:

a first semiconductor layer containing at least a Group V element(s) other than nitrogen, the first semiconductor layer having a periodic structure and emitting induced emission light; and a second semiconductor layer comprising both nitrogen and a Group V element(s) other than nitrogen, wherein the nitrogen crystal mixture ratio in the second semiconductor layer is larger than the nitrogen crystal mixture ratio in the first semiconductor layer, the second semiconductor layer having a refractive index approximately equal to a refractive index of the first semiconductor layer and a bandgap wider than a bandgap of the first semiconductor layer, and wherein the periodic structure of the first semiconductor layer contacts the second semiconductor layer is buried flat in the second semiconductor layer.

2. The gain-coupled distributed-feedback type semiconductor laser device as claimed in claim 1, wherein the first semiconductor layer contains no nitrogen.

3. The gain-coupled distributed-feedback type semiconductor laser device as claimed in claim 1, wherein a laminate structure, which includes the first semiconductor layer and the second semiconductor layer, has a refractive index coupling coefficient $k_i$ of not greater than 5 cm$^{-1}$.

4. The gain-coupled distributed-feedback type semiconductor laser device as claimed in claim 1, wherein the second semiconductor layer contains indium and/or antimony at a prescribed crystal mixture ratio.

5. The gain-coupled distributed-feedback type semiconductor laser device as claimed in claim 1, wherein the first semiconductor laser is formed while being crystallinically grown on a surface whose plane index is (100) or a surface crystallographically equivalent to (100) plane, and the periodic structure is formed in a [010] direction or a [00-1] direction or a direction crystallographically equivalent to the [010] and/or [00-1] direction.

6. A gain-coupled distributed-feedback type semiconductor laser device having a laminate structure and comprising:

a first semiconductor layer having a periodic structure;

a second semiconductor layer comprising both nitrogen and a Group V element(s) other than nitrogen, wherein the nitrogen crystal mixture ratio in the second semiconductor layer is larger than the nitrogen mixture ratio in the first semiconductor layer, the second semiconductor layer having a refractive index approximately equal to a refractive index of the first semiconductor layer and a bandgap wider than a bandgap of the first semiconductor layer;

a third layer, in non-periodic form, for generating induced emission light, wherein the first semiconductor layer is located in the vicinity of one surface of the third layer, contains at least a Group V element(s) other than nitrogen and absorbs induced emission light generated from the third layer, and the second semiconductor layer is provided closely to and contacts the first semiconductor layer.

7. The gain-coupled distributed-feedback type semiconductor laser device as claimed in claim 6, wherein the first semiconductor layer contains no nitrogen.

8. The gain-coupled distributed-feedback type semiconductor laser device as claimed in claim 6, wherein a laminate structure, which includes the first semiconductor layer and the second semiconductor layer, has a refractive index coupling coefficient $k_i$ of not grater than 5 cm$^{-1}$.

9. The gain-coupled distributed-feedback type semiconductor laser device as claimed in claim 6, wherein the second semiconductor layer contains indium and/or antimony at a prescribed crystal mixture ratio.

10. The gain-coupled distributed-feedback type semiconductor laser device as claimed in claim 6, wherein the first semiconductor layer is formed while being crystallinically grown on a surface whose plane index is (100) or a surface crystallographically equivalent to (100) plane, and the periodic structure is formed in a [010] direction or a [00-1] direction or a direction crystallographically equivalent to the [010] or [00-1] direction.

* * * * *